(12) United States Patent
Onaka

(10) Patent No.: US 8,837,037 B2
(45) Date of Patent: Sep. 16, 2014

(54) OPTICAL DELAY DEVICE, OPTICAL CIRCUIT, AND OPTICAL DELAY METHOD

(75) Inventor: Miki Onaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 308 days.

(21) Appl. No.: 13/425,024

(22) Filed: Mar. 20, 2012

(65) Prior Publication Data

US 2012/0293856 A1    Nov. 22, 2012

(30) Foreign Application Priority Data

May 19, 2011    (JP) .................................. 2011-112770

(51) Int. Cl.
  *H01S 3/00*    (2006.01)
(52) U.S. Cl.
  USPC .............................. 359/333; 398/53; 398/102
(58) Field of Classification Search
  USPC ..................... 359/333; 398/102, 53
  See application file for complete search history.

(56) References Cited

U.S. PATENT DOCUMENTS

| | | | |
|---|---|---|---|
| 5,533,154 A * | 7/1996 | Smith ............................. | 385/27 |
| 6,987,904 B2 | 1/2006 | Kawanishi et al. | |
| 2007/0047601 A1* | 3/2007 | Yu .................................... | 372/25 |
| 2012/0219290 A1* | 8/2012 | Scaffardi et al. ................. | 398/39 |

FOREIGN PATENT DOCUMENTS

| | | |
|---|---|---|
| JP | 7056118 | 3/1995 |
| JP | 8023306 | 1/1996 |
| JP | 2001-242494 | 9/2001 |
| JP | 2003-057698 | 2/2003 |
| JP | 2003-207812 | 7/2003 |

* cited by examiner

*Primary Examiner* — Mark Hellner
(74) *Attorney, Agent, or Firm* — Fujitsu Patent Center

(57) ABSTRACT

An optical delay device includes an optical path in which an input optical signal travels the same path recursively; an optical switch that switches between an output state of outputting the optical signal input to the optical path, and a non-output state of not outputting the optical signal input to the optical path; and a controller that sets the optical switch to the non-output state until a point in time when a given delay time elapses since input of the optical signal to the optical path and at the point in time when the given delay time elapses, switches the optical switch to the output state.

20 Claims, 24 Drawing Sheets

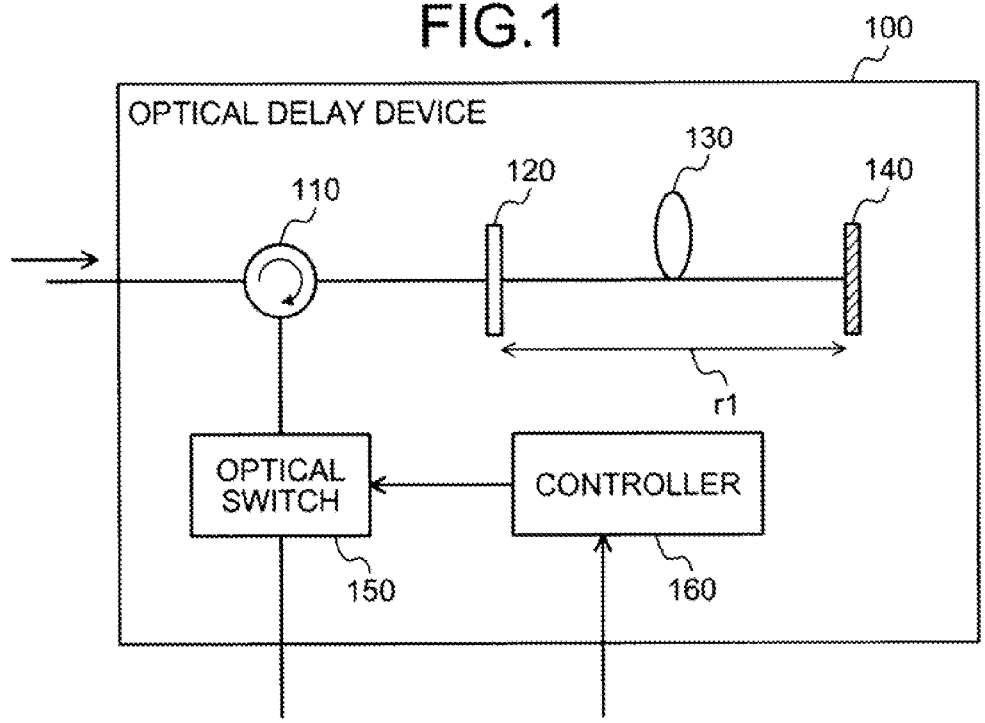
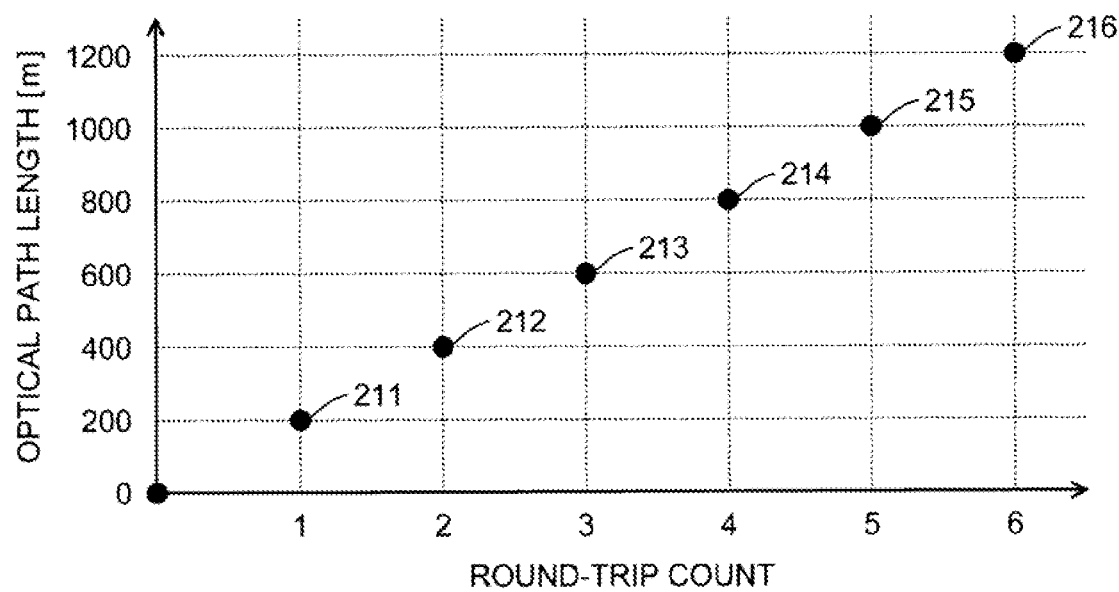

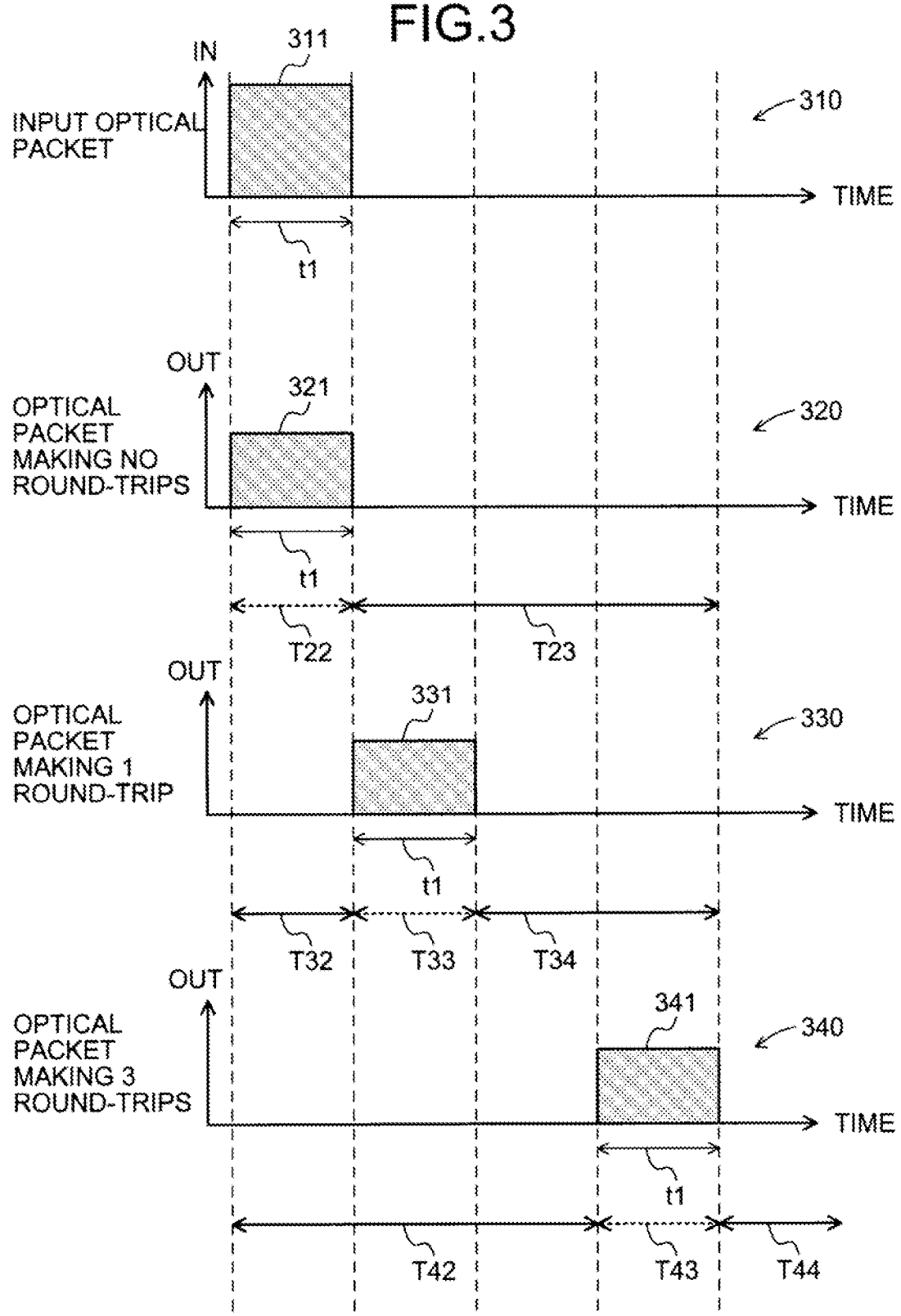

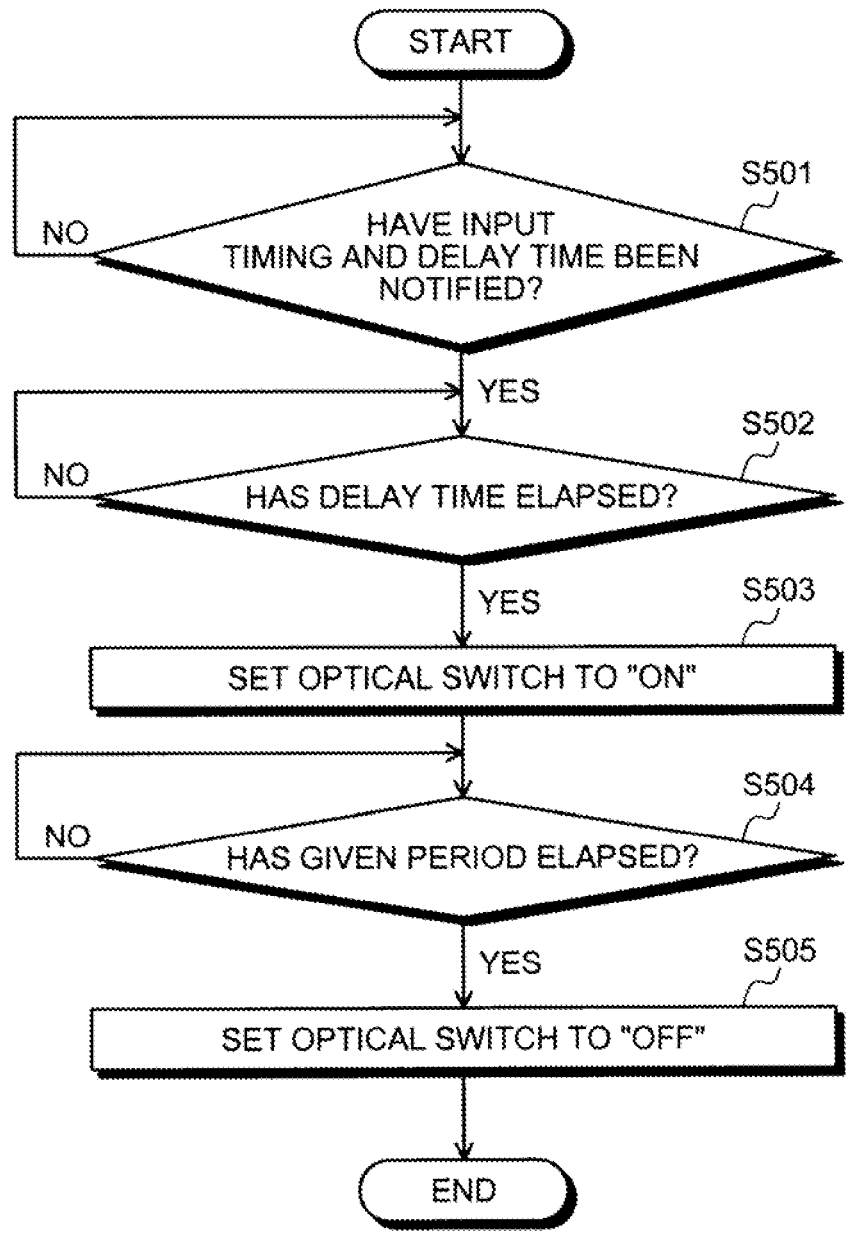

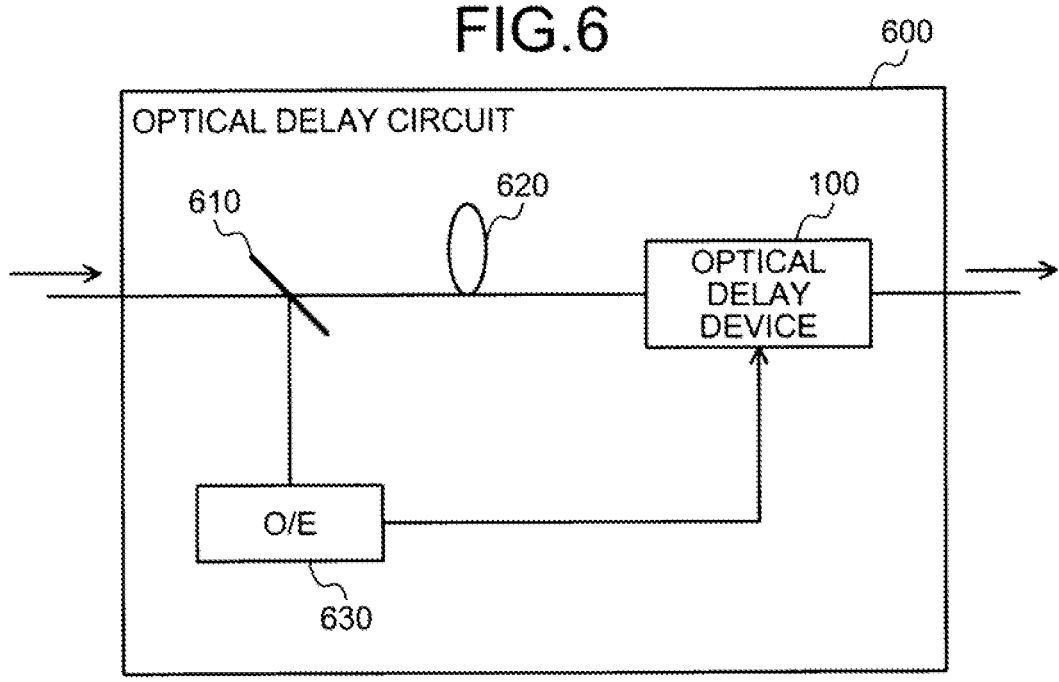

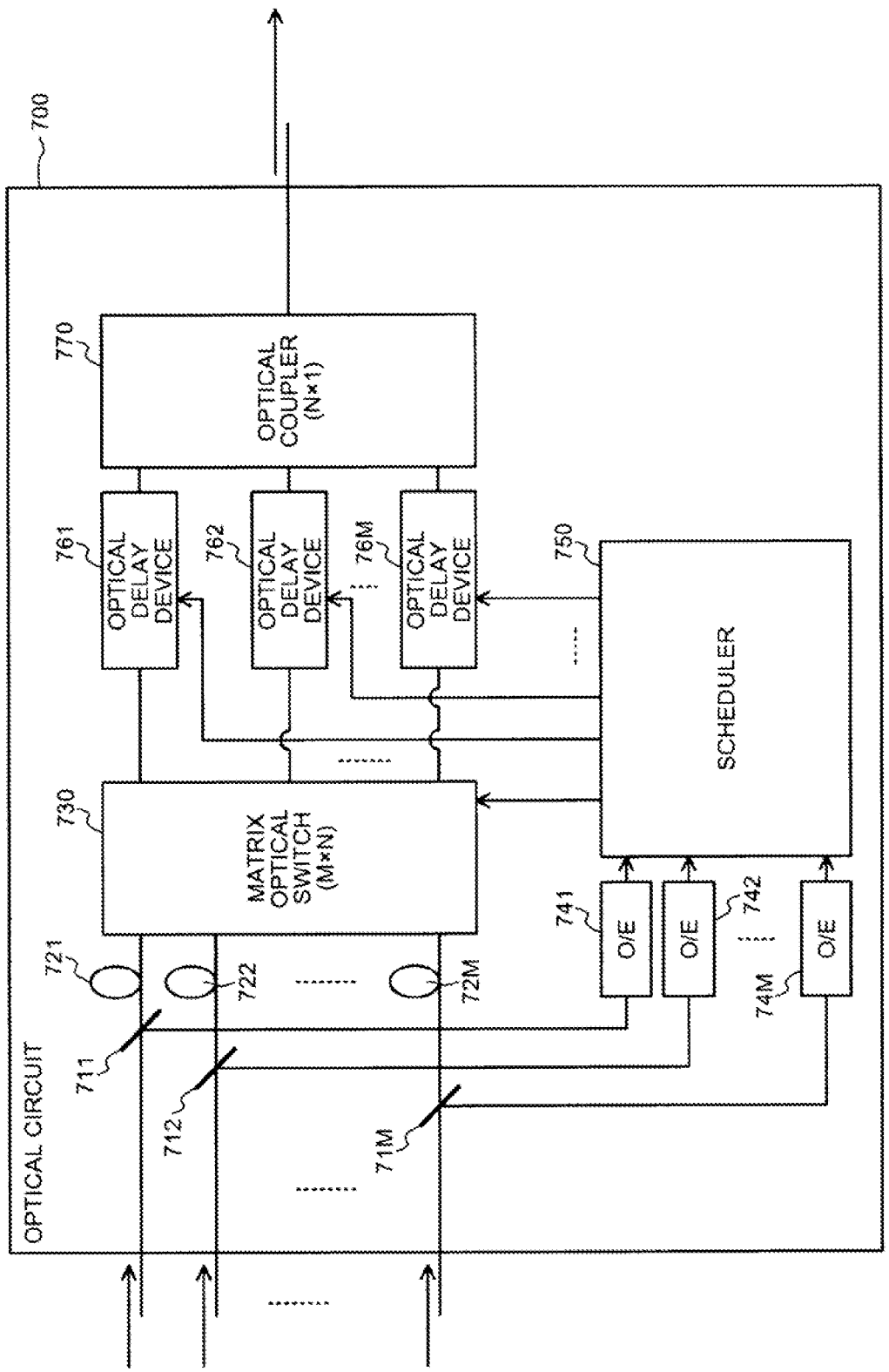

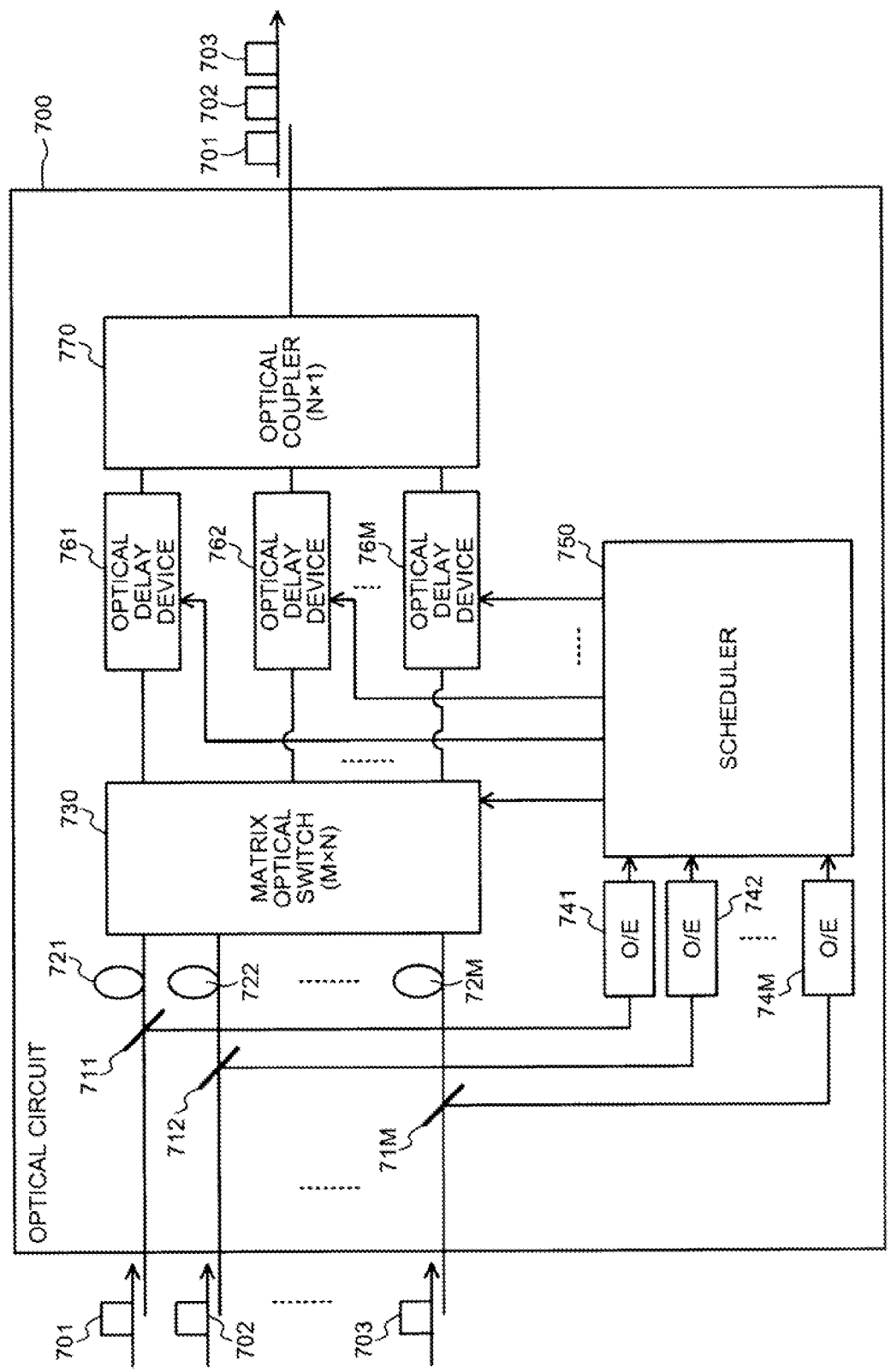

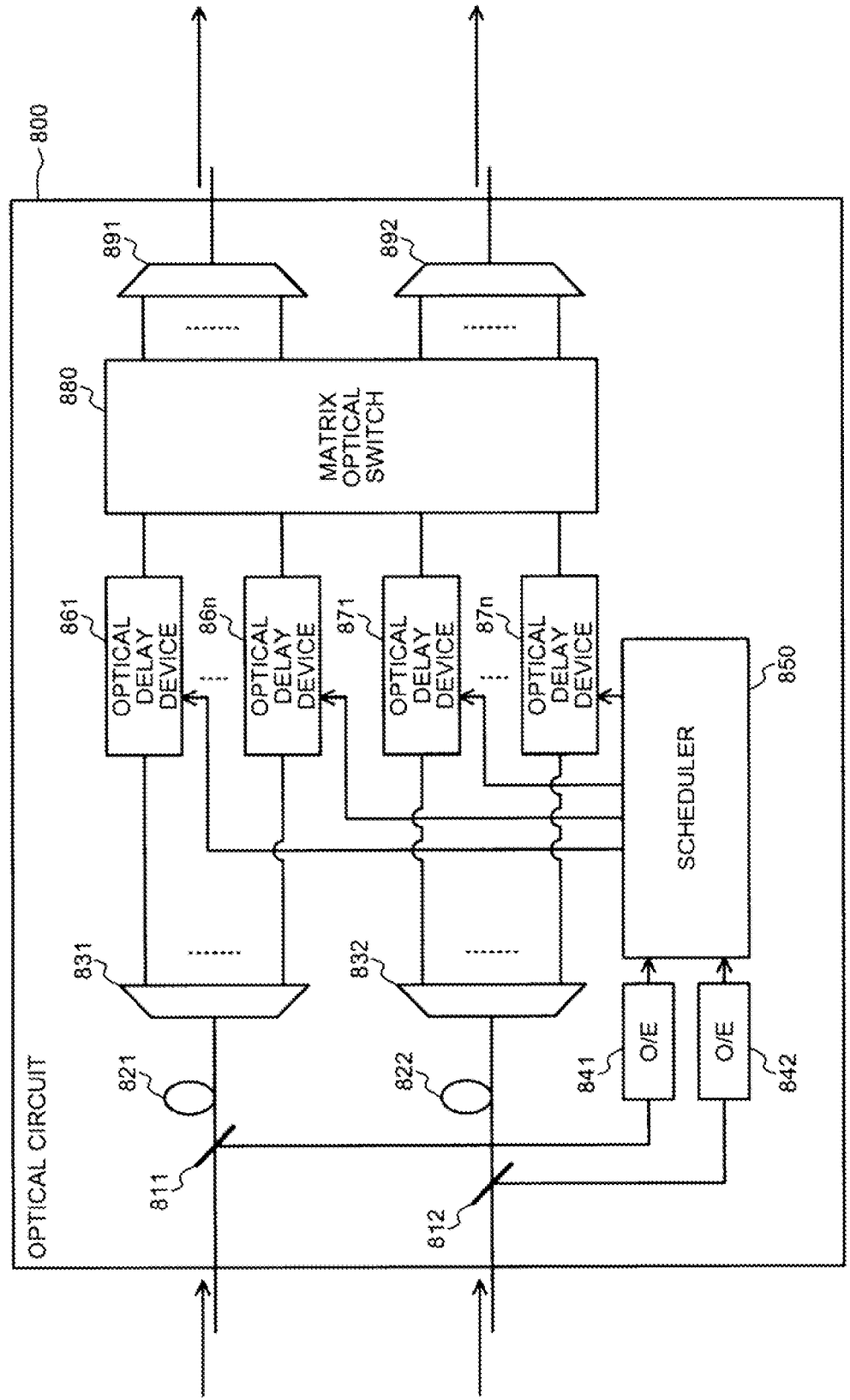

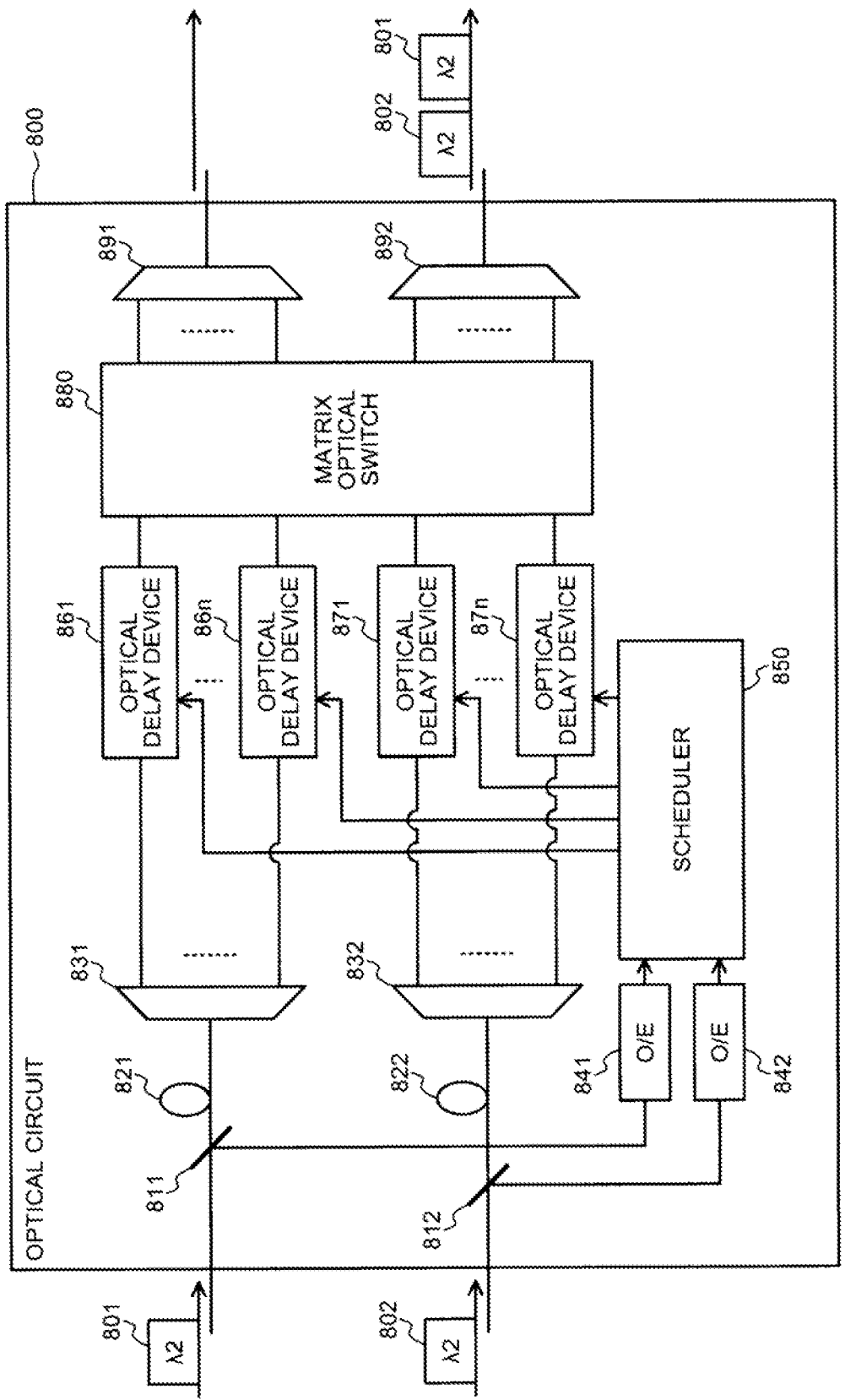

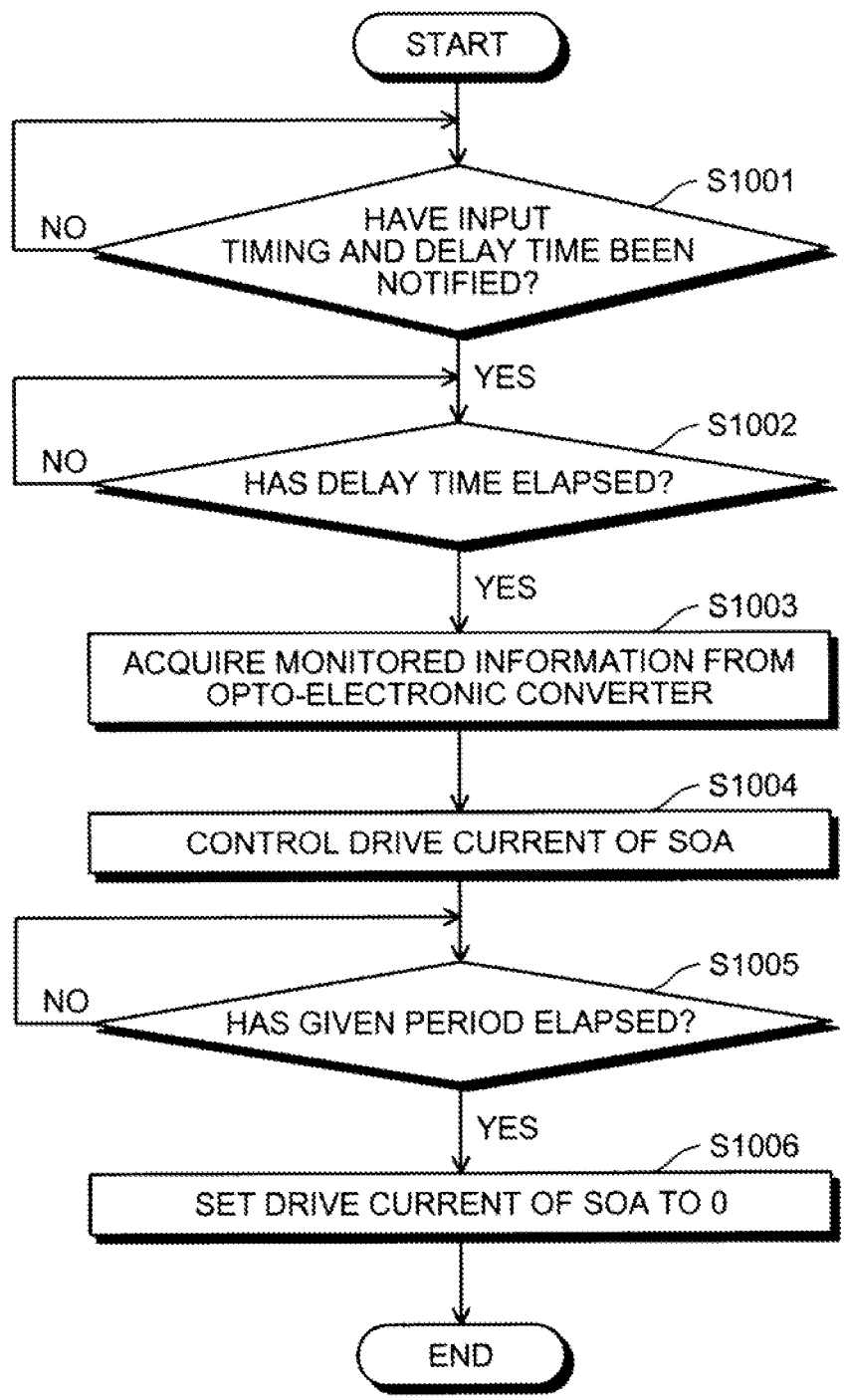

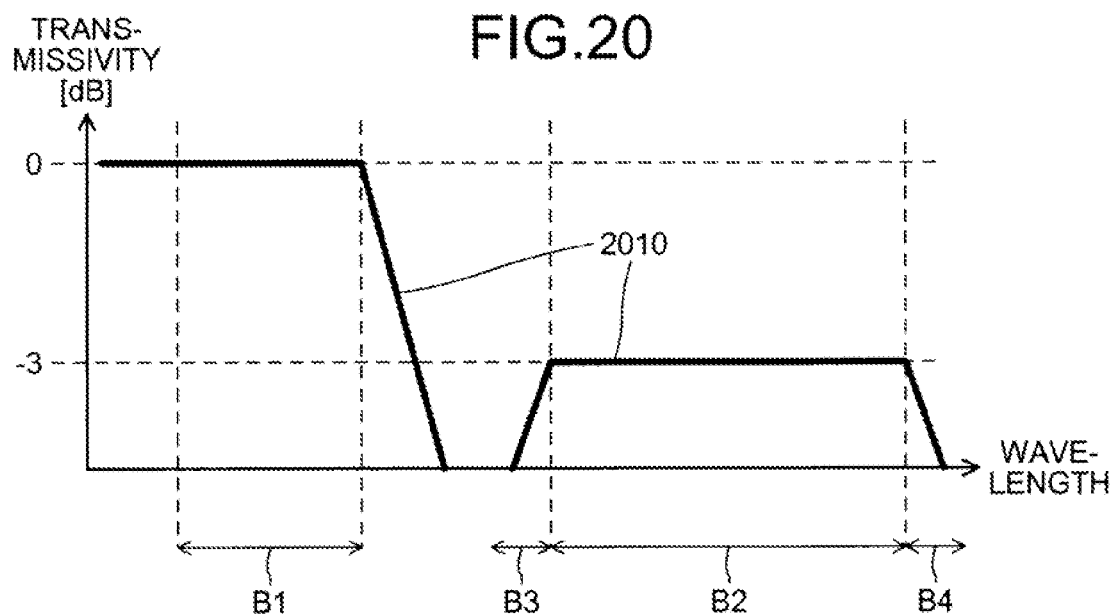
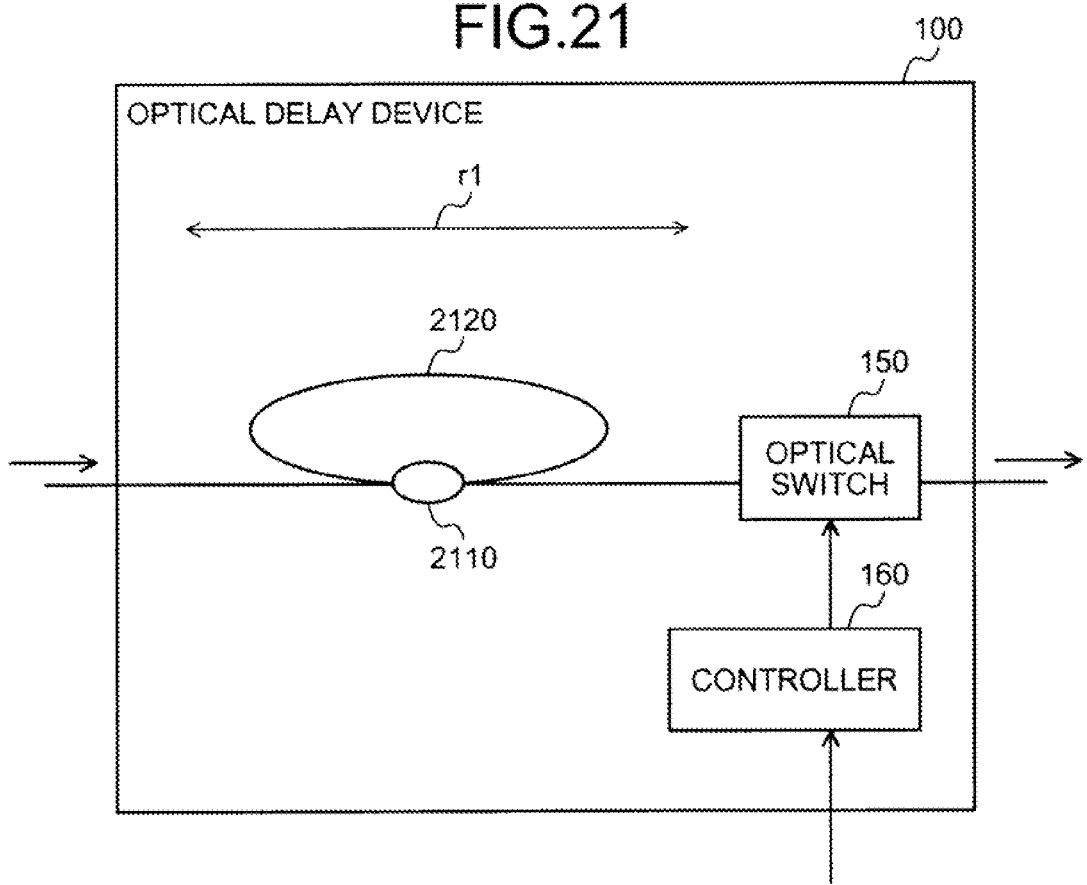

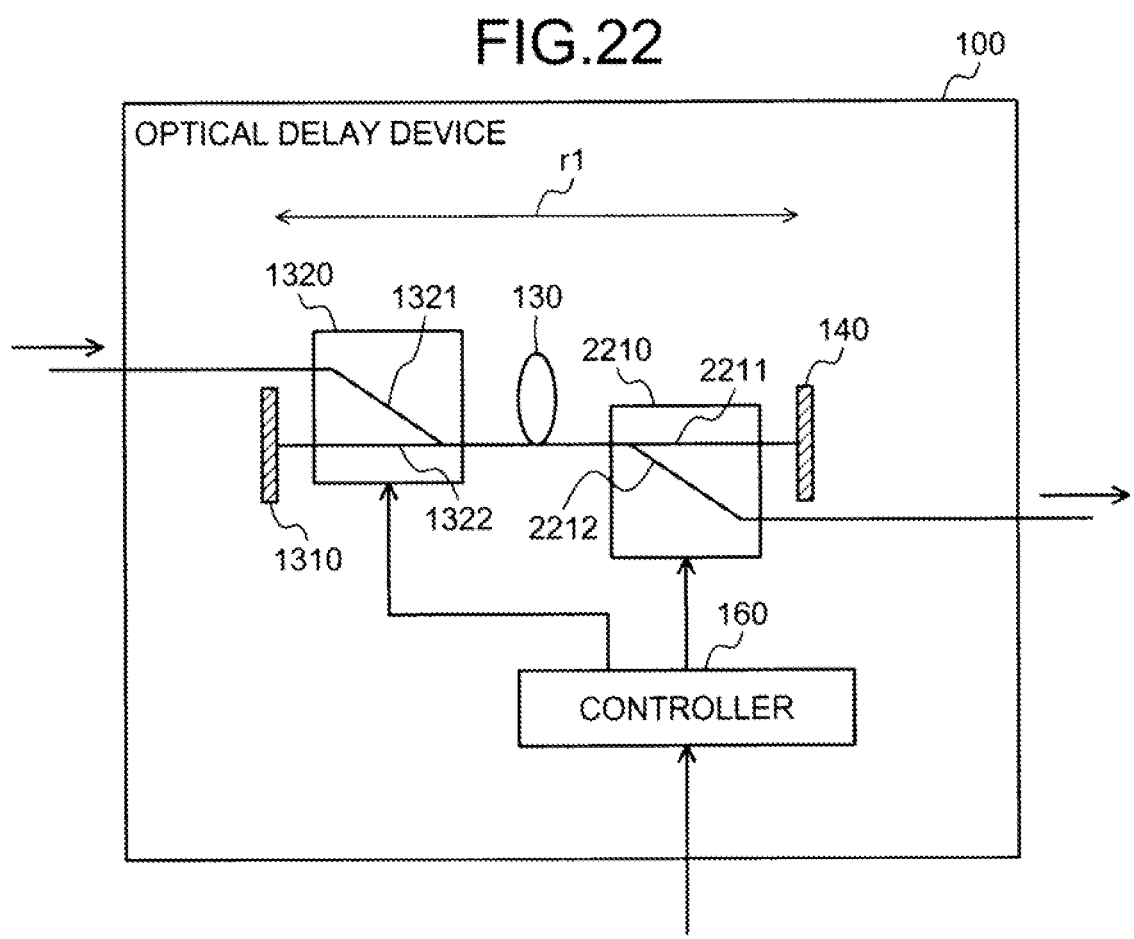

OPTICAL DELAY DEVICE, OPTICAL CIRCUIT, AND OPTICAL DELAY METHOD

CROSS REFERENCE TO RELATED APPLICATIONS

This application is based upon and claims the benefit of priority of the prior Japanese Patent Application No. 2011-112770, filed on May 19, 2011, the entire contents of which are incorporated herein by reference.

FIELD

The embodiments discussed herein are related to an optical delay device, an optical circuit, and an optical delay method that delay optical signals.

BACKGROUND

Consequent to the prevalence of the internet in recent years, communication traffic is increasing. Thus, optical fiber transmission technology, in which optical signals are carried by a single optical fiber, is used as a technique for coping with the increases in communication traffic. In addition to the extension of primary trunk systems over long distances and high capacity systems, more flexible and more economical transport networks are being built and phototonic networks are being configured for a society reliant on large volumes of information. These networks are not only metros (metropolitan area networks), but are assumed to be drawn in proximately to offices and residences, and lower cost and more flexible phototonic networks are demanded.

At each node of such systems, an output function of switching paths according to destination is demanded of conventional optical cells or time slots (optical packets). In a communication scheme to build a flexible network, multiple optical packets may be output to the same path and a collision of optical signals may occur. Optical signals that have collided with one another, for example, cannot be read, result in reception errors, and are discarded. The discarding of optical packets not only affects system reliability, but also causes the transmitter to repeatedly send the optical packets until the optical packets are received normally, which decreases the efficiency of the network.

To prevent such circumstances, the scheduling and buffering of the various types of optical signals arbitrarily transmitted from various senders to the nodes is demanded. A scheduler manages the timing at which optical signals are sent, based on the destination of the optical signal. As a buffer, a configuration is known where an optical signal is converted into an electrical signal and stored in an electronic buffer, from which the signal is taken and converted back into an optical signal and sent. Nonetheless, since opto-electronic conversion and electro-optic conversion are used, there are limits in terms of capacity and speed, resulting in increases in power consumption as well as in the complexity and size of the apparatus.

In contrast, optical buffers that delay optical signals as is in the form of light are under investigation (see, for example, Japanese Laid-Open Patent Publication Nos. H8-23306, 2003-57698, 2003-207812, and 2001-242494). An optical buffer prevents the collision of optical signals input at an identical timing and are used not only for decreasing the optical packet discard rate, but also in controlling the transmission sequence of optical signals such that optical signals of high priority are transmitted first. As a conventional optical buffer, a configuration is known in which, for example, multiple optical fibers of differing lengths are arranged in parallel. In this configuration, when an optical signal is to be delayed by a long period, the optical signal is transmitted through a long distance optical fiber and when the optical signal is to be delayed by a short period, the optical signal is passed through a short distance optical fiber, whereby the delay period is adjusted to a desired period.

Nonetheless, with the conventional technologies above, a problem arises in that the size of a configuration to induce a given delay on an optical signal becomes large. For example, in the configuration where multiple optical fibers of differing lengths are arranged in parallel, multiple optical fibers of several hundred [m] to several [km] have to be preliminarily installed, whereby the scale of the hardware becomes large.

For example, in a conventional method such as that of preparing fibers of differing lengths, the configuration of the large-scale hardware is complicated and the introduction of the actual system is not only unrealistic, but invalid hiatuses between packets (gaps between packets) occur since the selectable delay periods are discontinuous. The invalid hiatuses, which cannot be used and occur between packets, are inefficient with respect to reducing the packet discard rate and make flexible organization of traffic congestion difficult. As a means of preventing this bottleneck, optical buffer functions of a simple optical circuit structure and having a small size as well as a function enabling minute variation of the delay are demanded.

Further, in the conventional technologies, in order to obtain flexibility in terms of delay, an unrealistically large facility would be necessary. For example, if one slot time of an optical packet is 1 [μs] and the optical path length therefore is 200 [m], the transmission paths would be 09 [m], 200 [m], 400 [m], 600 [m], 800 [m], 1000 [m], 1200 [m], 1400 [m], 1600 [m], 1800 [m], 2000 [m], ..., ∞.

Additionally, in the conventional technologies, to obtain flexibility in terms of delay, for example, the number of optical switch matrices, the number of fiber lengths downstream from optical switches, etc. would have to be increased and a large number of optical paths would be necessary. Consequently, the add loss at matrix optical switches and at m×1 and K×m couplers would increase; and SN would deteriorate as would optical transmission characteristics.

In a configuration that modulates optical packets by a single side band (SSB) modulator while looping the optical packets and that takes optical packets from the loop according to the wavelength variation consequent to the modulation, since the add loss of the SSB modulator is large (e.g., 10 [dB]), a large loss is incurred at each looping of the optical packets. As a result, the optical transmission characteristics deteriorate. Although compensation of this large add loss by an addition of an optical amplifier may be considered to prevent this occurrence, every few loops, problems arise in that optical noise generated by the optical amplifier accumulates and increases, and optical amplifiers having a large gain are costly. Furthermore, the full potential of SSB modulators is not exhibited with high speed signals, i.e., typically, at maximum, only signal light on the order of 20-25 [Gb/s] can be coped with and for example, a speed of 40 [Gb/s] is difficult to cope with.

Further, in the conventional technologies, the delay time is dependent on the number of times that the wavelength is shifted (number of loops). In addition, the disposal of an optical amplifier restricts the amplification band to approximately 30 [nm], for example. As a result, for example, wide band application, such as WDM, is difficult.

SUMMARY

According to an aspect of an embodiment, an optical delay device includes an optical path in which an input optical signal travels the same path recursively; an optical switch that switches between an output state of outputting the optical signal input to the optical path, and a non-output state of not outputting the optical signal input to the optical path; and a controller that sets the optical switch to the non-output state until a point in time when a given delay time elapses since input of the optical signal to the optical path and at the point in time when the given delay time elapses, switches the optical switch to the output state.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram depicting an example of a configuration of an optical delay device according to a first embodiment.

FIG. 2A is a diagram depicting an example of the relationship between the number of reflections of an optical packet and distance.

FIG. 3 is a diagram depicting an example of the delay time induced on an optical packet.

FIG. 5 is a flowchart of an example of control by a controller.

FIG. 6 is a diagram depicting an example of a basic configuration of an optical delay circuit that includes the optical delay device.

FIG. 7A is a diagram of a first configuration example of an optical circuit that includes the optical delay device.

FIG. 7B is a diagram of an example of optical packet control by the optical circuit depicted in FIG. 7A.

FIG. 8A is a diagram of a second configuration example of the optical circuit that includes the optical delay device.

FIG. 8B is a diagram of an example of optical packet control by the optical circuit depicted in FIG. 8A.

FIG. 10 is a flowchart of an example of control by the controller.

FIG. 20 is a diagram depicting a second example of properties of the optical filter depicted in FIG. 18.

FIG. 21 is a diagram of a first example of modification of the optical delay device.

FIG. 22 is a diagram of a second example of modification of the optical delay device.

DESCRIPTION OF EMBODIMENTS

Figure 2B:
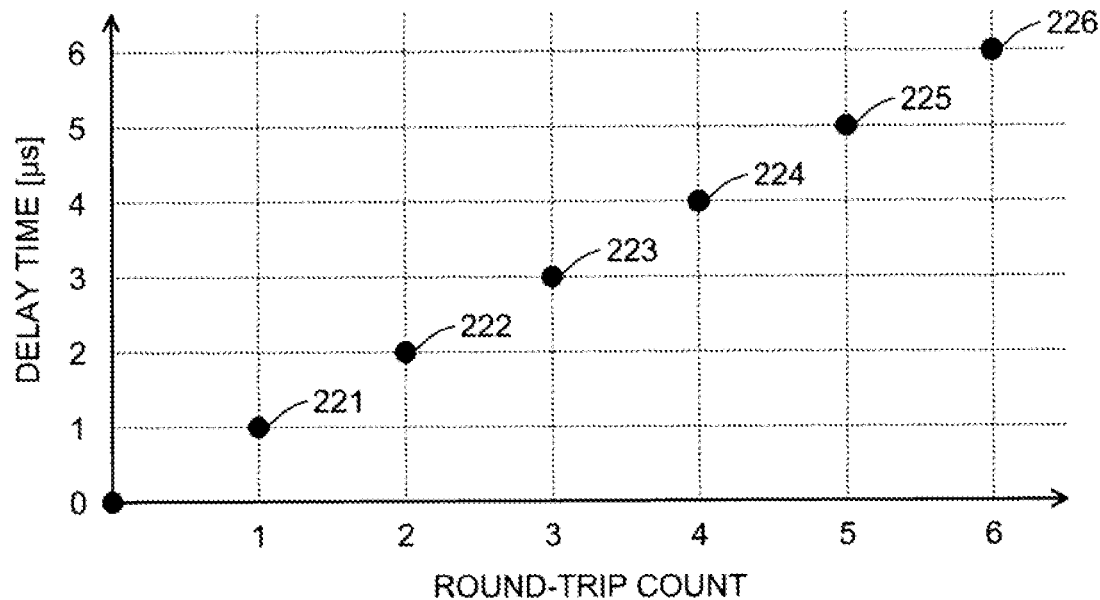
FIG. 2B is a diagram depicting an example of the relationship between the number of reflections of the optical packet and delay time.

Preferred embodiments of the present invention will be explained with reference to the accompanying drawings.

FIG. 1 is a diagram depicting an example of a configuration of an optical delay device according to a first embodiment. An optical delay device 100 depicted in FIG. 1 is an optical delay device (optical buffer) that delays input optical packets (optical signal) by a given (variable) delay amount (delay time) and outputs the delayed optical packets. The delay amount, for example, is determined based on information indicating the delay time to be induced on the optical packets. As depicted in FIG. 1, the optical delay device 100, for example, includes a circulator 110, a mirror 120, a delay line 130, a mirror 140, an optical switch 150, and a controller 160.

An optical path connecting the circulator 110, the mirror 120, the delay line 130, the mirror 140, and the optical switch 150 can be implemented by, for example, an optical fiber. The circulator 110 outputs to the mirror 120, an optical packet input to the optical delay device 100. The circulator 110 further outputs to the optical switch 150, the optical packet from the mirror 120.

Use of the circulator 110 enables the optical packet from the mirror 120 to be output to the optical switch 150 without returning to an input device of the optical delay device 100. In other words, application of the circulator 110 enables the traveling direction of light to be maintained in a given direction and enables travel in the opposite direction to be suppressed.

The mirror 120 is a reflective medium having a transmissive portion of a given transmissivity (e.g., 50%) (such as a half mirror). For example, the mirror 120 reflects at a given reflectivity (e.g., 50%) and to the circulator 110, light output from the circulator 110, and transmits the remaining light to the delay line 130. The mirror 120 further reflects at the given reflectivity (e.g., 50%) and to the delay line 130, light headed from the delay line 130 toward the mirror 120, and transmits the remaining light to the circulator 110.

The delay line 130 delays by a given amount of time, the optical packet (light) from the mirror 120 and outputs the delayed optical packet (light) to the mirror 140. The delay line 130 further delays by a given amount of time, the optical packet (light) from the mirror 140 and outputs the delayed optical packet (light) to the mirror 120. The delay line 130 can be implemented by, for example, a coiled optical fiber.

The mirror 140 reflects to the delay line 130, the optical packet (light) output from the delay line 130. The reflectivity of the mirror 140 is ideally, for example, 100%. The mirror 120, the delay line 130, and the mirror 140 form an optical path r1 (optical circuit) along which the input optical packet (light) is recursively transmitted. For example, an optical packet input from the circulator 110 is recursively reflected between the mirrors 120, 140 (reflective media). In this case, the circulator 110 and the mirror 120 form an input device that inputs to the optical path r1, an optical packet that is to be delayed.

The length of the optical path including the delay line 130 between the mirror 120 and the mirror 140 is more than or equal to ½ the distance travelled by light during the maximum slot time (temporal length) of the optical packets input to the optical delay device 100. Consequently, the time consumed by the optical packet to travel the optical path r1 round-trip once is more than or equal to the maximum optical packet slot time.

In other words, the optical path r1 is of a length (e.g., one-way from the mirror 120 to the mirror 140) that can be travelled in less than or equal to the maximum optical packet slot time. Therefore, the optical path r1 has an optical path length greater than or equal to the distance covered by an optical packet from head to tail, along the optical path in the direction of the time axis. Thus, in the optical packet, different portions (e.g., the head and the tail) of an optical packet traveling round-trip in the optical path r1 can be prevented from interfering with one another and the number of times that each of the different portions is reflected does not differ. Consequently, deterioration of the optical packet waveform can be prevented.

Therefore, a portion of the optical packet input to the optical delay device 100 is reflected by the mirror 120 and output to the optical switch 150; and the remaining portion is recursively reflected between the mirror 120 and the mirror 140. Furthermore, a portion of the optical packet that is recursively reflected between the mirror 120 and the mirror 140 is transmitted by the mirror 120 and output to the optical switch 150, each time the optical packet is incident upon the mirror 120. Consequently, the optical packet is input to the optical switch 150, having been delayed by a delay time that differs from the optical packet input to the optical delay device 100.

The optical switch 150 is an optical switch capable of switching between a non-output state in which the optical packet input to the optical path r1 is not output and an output state in which the optical packet input to the optical path r1 is output. For example, the optical switch 150 passes (ON) or blocks (OFF) light that is from the optical path r1, is transmitted by the mirror 120, and output from the circulator. The optical switch 150 switches between ON and OFF according to a control signal output from the controller 160.

Information that indicates the timing at which the optical packets are to be input to the optical delay device 100 and the delay time to be induced on the input optical packets is input to the controller 160. Based on the input information, the controller 160 outputs a control signal to the optical switch 150 and thereby switches the ON/OFF state (output state/non-output state) of the optical switch 150. The delay time, for example, is a period of time that is an integral multiple (may include 0) of the time consumed for light to travel 1 round-trip cycle along the optical path r1.

For example, the controller 160 determines when a given delay time has elapsed since the input of an optical packet to the optical delay device 100. The controller 160 is a controller that when a desired delay time has elapsed, performs control such that the optical packet is transmitted by the optical switch. The controller 160 sets the optical switch 150 to OFF (non-output state) until the given delay time has elapsed since the input of the optical packet to the optical delay device 100. Further, at the time when the given delay time has elapsed since the input of the optical packet, the controller 160 switches the optical switch 150 to ON (output state). Thus, among the packets input to the optical switch 150, an optical packet delayed by a given delay time can be output.

When the optical switch 150 is set to ON, the controller 160 sets the optical switch 150 to be ON for a period longer that the temporal length of the optical packet. The period of time that the optical switch 150 is ON, for example, is a period of time that is more than or equal to 1 optical packet slot (when less than 1 slot, the optical packet signal does not completely pass through the optical switch from head to tail). The controller 160 switches the optical switch 150 to OFF when the temporal length of the optical packet has elapsed since the setting of the optical switch to ON. Thus, the output of packets can be limited to only packets that have been delayed by a given delay time, among the packets input to the optical switch 150.

As a result, optical packets input to the optical delay device 100 can be delayed by a given delay time and output. The controller 160, for example, can be implemented by a processor such as a central processing unit (CPU). Further, the controller 160 may be disposed independently of the optical delay device 100. In this case, the optical switch 150 is controlled by a control signal from an external device of the optical delay device 100. The controller 160 may have a function of a scheduler (buffer manager, routing control).

Herein, optical packet delay time by the optical delay device 100 has been described. The distance travelled by light in 1 second is 299792458 [m] (assuming a refractive index of 1), in the case of a refractive index of 1.45 for a typical optical fiber, the distance is 206753419 [m]. The distance between the mirror 120 and the mirror 140 is assumed to be A[m]. The length of the path from the input of light to the optical delay device 100 up to the circulator 110 is assumed to be B[m]. The distance between the circulator 110 and the mirror 120 is assumed to be C[m]. The distance between the circulator 110 and the optical switch 150 is assumed to be D[m]. The round-trip count between the mirror 120 and the mirror 140, for an optical packet is N.

In this case, the distance travelled along the path from the input of an optical packet to the optical delay device 100 until the output of the optical packet by the optical switch 150 is (B+C+D)+2A×N. Therefore, the period of time (delay time) from the input of the optical packet to the optical delay device 100 until the output of the optical packet by the optical switch 150 is ((B+C+D)+2A×N)/206753419 for a typical optical fiber having a refractive index of 1.45.

FIG. 2A is a diagram depicting an example of the relationship between the number of reflections of an optical packet and distance. In FIG. 2A, the horizontal axis indicates the number of times an optical packet travels round-trip between the mirror 120 and the mirror 140. The vertical axis indicates the distance covered by the optical packet traveling round-trip between the mirror 120 and the mirror 140. Further, description is given with the assumption that the optical path length between the mirror 120 and the mirror 140 is 100 [m] (i.e., round-trip: 200 [m]).

As indicated by the coordinate points 211 to 216 depicted in FIG. 2A, the more times the optical packet travels round-trip between the mirror 120 and the mirror 140, the greater the distance covered by optical packet is. For example, the distance covered by an optical packet traveling round-trip between the mirror 120 and the mirror 140 is the distance obtained by multiplying 200 [m] by the number of times the optical packet travels round-trip between the mirror 120 and the mirror 140.

The length of the optical path between the circulator 110 and the mirror 120 and the length of the optical path between the circulator 110 and the optical switch 150 are sufficiently short with respect to the optical path r1 (which includes the delay line 130) and therefore, is not considered herein.

FIG. 2B is a diagram depicting an example of the relationship between the number of reflections of the optical packet and delay time. In FIG. 2B, description of portions identical to those depicted in FIG. 2A are omitted herein. The vertical axis in FIG. 2B indicates the delay time [μs] induced on the optical packet traveling round-trip between the mirror 120 and the mirror 140.

As indicated by the coordinate points 221 to 226 depicted in FIG. 2B, the more times the optical packet travels round-trip between the mirror 120 and the mirror 140, the greater the delay time induced on the optical packet is. For example, assuming the optical packet travels round-trip once between the mirror 120 and the mirror 140 in 1 [μs], the delay time induced on the optical packet is the product of 1 [μs] multiplied by the number of times that the optical packet travels round-trip between the mirror 120 and the mirror 140.

Figure 2C:
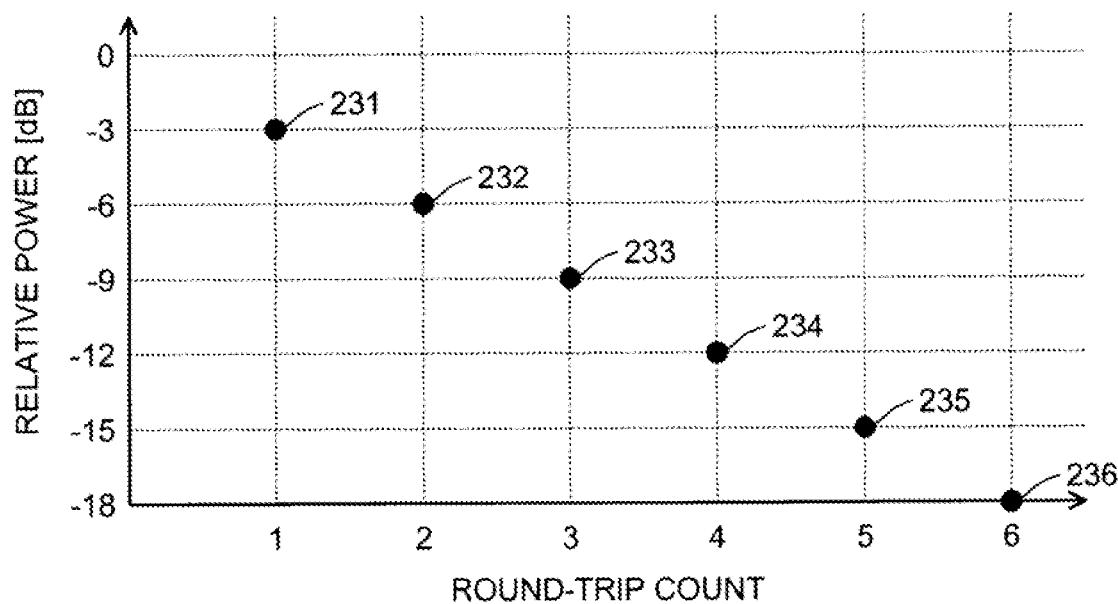
FIG. 2C is a diagram depicting an example of the relationship between the number of reflections of the optical packet and power.

FIG. 2C is a diagram depicting an example of the relationship between the number of reflections of the optical packet and power. In FIG. 2C, description of portions identical to those depicted in FIG. 2A will be omitted herein. The vertical axis in FIG. 2C indicates the power of the optical packet traveling round-trip between the mirror 120 and the mirror 140 as a relative value [dB] of the power of the optical packet input to the optical delay device 100. With respect to FIG. 2C, description is given with the assumption that the transmissivity of the mirror 120 is 50%.

As indicated by the coordinate points 231 to 236 depicted in FIG. 2C, the more times the optical packet travels round-trip between the mirror 120 and the mirror 140, the lower the power of the optical packet becomes. For example, the power of optical packet traveling round-trip along the optical path r1 decreases by 3 [dB] each time the optical packet is reflected by the mirror 120.

FIG. 3 is a diagram depicting an example of the delay time induced on an optical packet. In FIG. 3, the horizontal axis indicates time; the vertical axis indicates optical power. Slot time t1 is the longest slot time of an optical packet 311. In FIG. 3, slot time t1 is assumed to be 1 [μs]. The optical packet 311 in graph 310 is an optical packet input to the optical delay device 100.

An optical packet 321 in graph 320 is an optical packet that is input to the optical switch 150 without traveling round-trip along the optical path r1. In other words, the optical packet 321 is an optical packet that is output from the circulator 110 to the mirror 120 and reflected to the circulator 110, by the mirror 120. Therefore, compared to the optical packet 311 input to the optical delay device 100, the delay amount of the optical packet 321 is substantially 0. The controller 160 sets the optical switch 150 to be ON during interval T22 when the optical packet 321 is input to the optical switch 150. The controller 160 further sets the optical switch 150 to be OFF during interval T23 subsequent to interval T22. As a result, the optical packet 321 can be output having a delay amount that is substantially 0.

An optical packet 331 in graph 330 is an optical packet that travels round-trip along the optical path r1 one time and then is input to the optical switch 150. Therefore, compared to the optical packet 311 input to the optical delay device 100, delay amount of the optical packet 331 becomes approximately 1 [μs]. The controller 160 sets the optical switch 150 to be ON during interval T33 when the optical packet 331 is input to the optical switch 150. The controller 160 further sets the optical switch 150 to be OFF during intervals T32, T34, which differ from interval T33. As a result, the optical packet 331 can be output having a delay amount of approximately 1 [μs].

An optical packet 341 in graph 340 is an optical packet that travels round-trip along the optical path r1 three times and then is input to the optical switch 150. Therefore, compared to the optical packet 311 input to the optical delay device 100, the delay amount of the optical packet 341 becomes approximately 3 [μs]. The controller 160 sets the optical switch 150 to be ON during interval T43 when the optical packet 341 is input to the optical switch 150. The controller 160 further sets the optical switch 150 to be OFF during intervals T42, T44, which differ from interval T43. As a result, the optical packet 341 can be output having a delay amount of approximately 3 [μs].

In this manner, according to the optical delay device 100 depicted in FIG. 1, an input optical packet can be delayed by a given delay time and output. The delay time of the optical packet can be varied, for example, in units of cycles, one cycle being round-trip travel of light along the optical path r1. Further, since one cycle of the light traveling round-trip along the optical path r1 is set to be greater than or equal to the maximum optical packet slot length, the delay time of the optical packet can be varied in units of the optical packet slot length. As a result, for example, in a node of the optical communication system, control such that optical packets do not collide is facilitated.

If the length of the optical path between the mirror 120 and the mirror 140 is too long, the variable delay time becomes long. Therefore, the length of the optical path between the mirror 120 and the mirror 140 is preferably set with consideration of the delay time required in the communication system. For example, as one example of a communication system, 1 optical packet slot time is assumed as 1 [μs], the required variable delay time is assumed to be 1 [μs] to 10 [μs], and the refractive index of the optical path r1 is assumed to be approximately 1.45.

In this case, the length of the optical path between the mirror 120 and the mirror 140 is set to be, for example, 100 [m] (i.e., round-trip: 200 [m]). As a result, the delay time of the optical packet can be varied between 1 [μs] and 10 [μs] by varying the number of reflections of the optical packet in the optical path r1, from 1 and 10.

However, the time for light to travel round-trip along the optical path r1 differs according to the refractive index of the optical path r1. For example, the higher the refractive index of the optical path r1 is, the longer the time is for light to travel round-trip along the optical path r1. Therefore, by using an optical medium having a refractive index greater than approximately 1.45 (e.g., silicon) in the optical path r1, the length of the optical path r1 can be made relatively shorter. Therefore, the size of the optical delay device 100 can be further reduced.

Further, in achieving the minimum delay time of 1 optical packet slot, the optical switch 150 preferably has high speed performance enabling switching that is at least less than or equal to 1/100 of 1 optical packet slot time in order to accurately time (synchronize) with the packet signal. For example, if 1 optical packet slot time is 1 [µs], to achieve the minimum delay time of 1 optical packet slot, for example, an optical switching having a 10 [ns] or less response speed is preferably used for the optical switch 150.

An optical switch using LN(LiNbO3) having an electro-optic effect, a semiconductor optical amplifier (SOA), etc. can be applied for the high speed optical switch 150. However, in the case of apparatuses that have a long interval between optical packet transmissions as well as in a case where at the head and tail of an optical packet, only low priority information that can be discarded is stored, etc., the optical switch 150 does not necessarily have to be a high speed optical switch.

Further, when twice the length of the optical path between the mirror 120 and the mirror 140 is longer than the optical path length of 1 optical packet slot, the interval between optical packets having delay times that differ increases and the optical packets are input to the optical switch 150. Therefore, the extraction of a particular optical packet by the optical switch 150 is facilitated. Consequently, for example, the optical switch 150 need not be a high speed switch. Alternatively, the control by the controller 160 need not be high speed.

Figure 4:
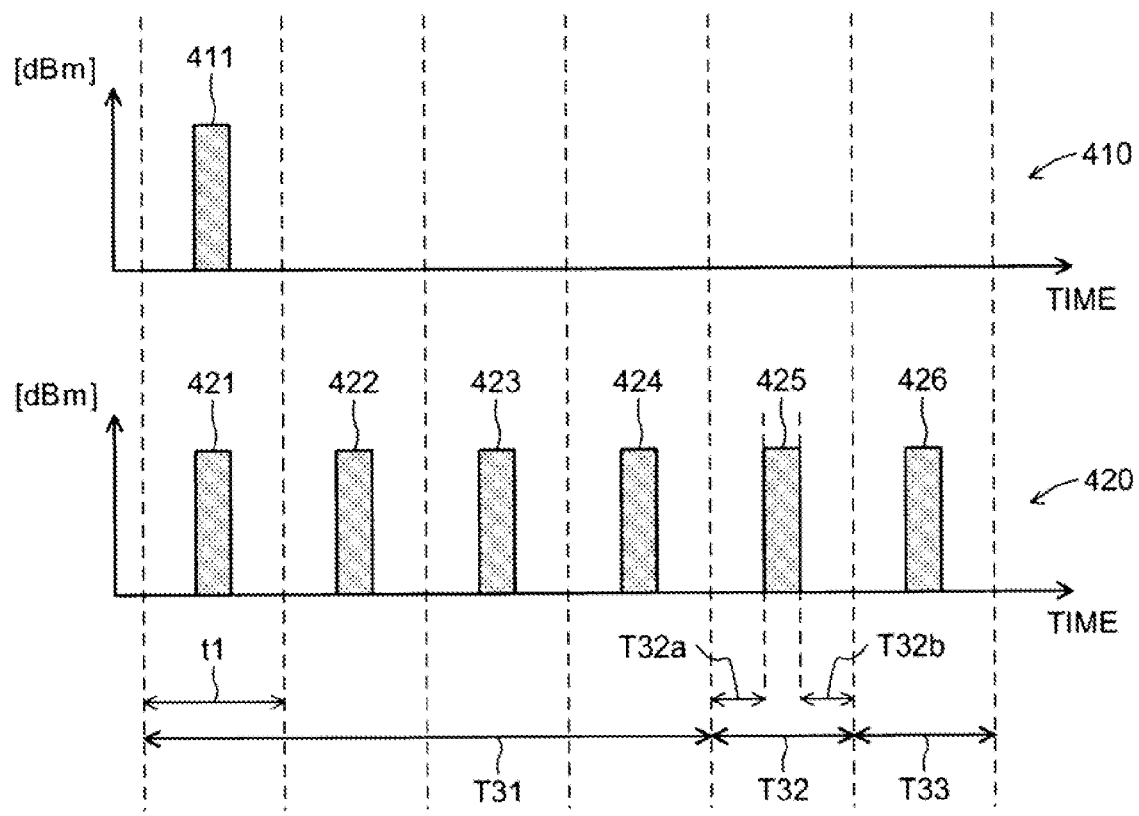
FIG. 4 is a diagram depicting an example of the switch timing of an optical switch.

FIG. 4 is a diagram depicting an example of the switch timing of the optical switch. In FIG. 4, the horizontal axis indicates time. The vertical axis represents optical power [dBm]. Slot time t1 is the longest slot time (e.g., 1 [µs]). An optical packet 411 in graph 410 is an optical packet input to the optical delay device 100. Optical packets 421 to 426 in graph 420 are optical packets that travel round-trip along the optical path r1 0 to 5 times, respectively, before being input to the optical switch 150. Here, an example will be described where the optical packet 425 (e.g., delay time=4 [µs]), which travels round-trip along the optical path r1 4 times, is output.

In this case, the controller 160 sets the optical switch 150 to be OFF during intervals T31, T33 when the optical packets 421 to 424, 426 are input to the optical switch 150. The controller 160 further switches the optical switch 150 to be ON during subinterval T32a when the head of the optical packet 425 has not yet reached the optical switch 150, during interval T32 when the optical packet 425 is input.

The controller 160 switches the optical switch 150 to be OFF during subinterval T32b after the tail of the optical packet 425 is output from the optical switch 150 and before the next optical packet (optical packet 426) reaches the optical switch 150, during interval T32. Consequently, the optical packet 425, from the head to the tail thereof, can be output from the optical switch 150 and the optical packets 424, 426, which are before and after the optical packet 425, can be prevented from being output from the optical switch 150.

FIG. 5 is a flowchart of an example of control by the controller. The controller 160, for example, recursively executes the steps depicted in FIG. 5. The optical switch 150 is assumed to be OFF (a state of not transmitting light) before the execution of the steps depicted in FIG. 5. The controller 160 determines whether notification of the input timing at which an optical packet is to be input to the optical delay device 100 and the delay time to be induced on the optical packet has been received (step S501), and if not, waits until notification is received (step S501: NO). The input timing and the delay time are notified by, for example, an external scheduler that manages the optical delay device 100.

At step S501, when notification of the input timing and the delay time has been received (step S501: YES), the controller 160 determines whether the notified delay time has elapsed since the notified time of input (step S502). If not, the controller 160 waits until the given delay time elapses (step S502: NO).

At step S502, when the delay time elapses (step S502: YES), the controller 160 sets the optical switch 150 to ON (step S503). The controller 160 determines whether a given period has elapsed since the optical switch 150 was set to ON at step S503 (step S504), and if not, waits until the given period elapses (step S504: NO). The given period is the time required for the signal of the optical packet delayed by the given delay time to be transmitted from head to tail, from the optical switch and is, for example, preferably the longest optical packet slot time prescribed by the apparatus specifications. The longest optical packet slot time may be preliminarily stored in the memory of the optical delay device 100, or may be notified by the scheduler.

At step S504, when the given period has elapsed (step S504: YES), the controller 160 sets the optical switch 150 to OFF (step S505), and ends the series of processes. By the steps above, an optical packet that has been delayed by the notified delay time can be output.

FIG. 6 is a diagram depicting an example of a basic configuration of an optical delay circuit that includes the optical delay device. As depicted in FIG. 6, an optical delay circuit 600 includes a splitter 610, a delayer 620, an opto-electronic converter 630, and the optical delay device 100. The splitter 610 slits an optical packet input to the optical delay circuit 600. The splitter 610 outputs the split optical packet to the delayer 620 and the opto-electronic converter 630. The delayer 620 delays by a given period, the optical packet output from the splitter 610 and outputs the delayed optical packet to the optical delay device 100.

Upstream from the optical delay device 100, the delayer 620 and the splitter 610 are disposed, whereby before the optical packet signal is input to the optical delay device, the optical delay device 100 can be notified of (instructed) the processing according to optical packet signal information by the opto-electronic converter 630.

The opto-electronic converter 630 (O/E) converts the optical packet output from the splitter 610 into an electrical signal and outputs the resulting electrical signal to the optical delay device 100. The optical delay device 100 is, for example, the optical delay device 100 depicted in FIG. 1. The optical delay device 100 delays, by a given delay time, the optical packet output from the delayer 620 and outputs the delayed optical packet.

For example, the controller 160 of the optical delay device 100, based on the electrical signal output from the opto-electronic converter 630, acquires the input timing and the delay time of the optical packet; and based on the acquired input timing and delay time, delays the optical packet. The optical packet delay time in the delayer 620 is set such that, for example, with respect to optical packet input to the optical delay device 100, the control of the delay performed by way of the opto-electronic converter 630 is timely.

The configuration of the optical delay circuit 600 depicted in FIG. 6 and including the optical delay device 100 is merely one example and the configuration of the optical delay device 100 is not limited hereto.

FIG. 7A is a diagram of a first configuration example of an optical circuit that includes the optical delay device. As depicted in FIG. 7A, an optical circuit 700 includes M splitters 711 to 71M (where, M is a natural number of 1 or more), M delayers 721 to 72M, a matrix optical switch 730, M opto-electronic converters 741 to 74M, a scheduler 750, N optical delay devices 761 to 76N (where, N is a natural number of 1 or more and less than or equal to M), and an optical coupler 770.

In the optical circuit 700, optical packets are assumed to be input from M paths. The splitters 711 to 71M are disposed respectively corresponding to the M paths. The splitter 711 splits the optical packet input from the path corresponding to the splitter 711 and outputs the split optical packet to the delayer 721 and the opto-electronic converter 741, respectively. Similarly, the splitters 712 to 71M respectively split the optical packet input from the path corresponding thereto and output the split optical packets to the delayers 722 to 72M and the opto-electronic converters 742 to 74M, respectively.

The delayers 721 to 72M respectively delay by a given period, the optical packets respectively output from the splitters 711 to 71M and output the delayed optical packets to the matrix optical switch 730. The matrix optical switch 730 is an M×N optical path switch (optical cross connect) that outputs to an arbitrary optical delay device among the optical delay devices 761 to 76N, the optical packets output from the delayers 721 to 72M. The path switching occurring at the matrix optical switch 730 is, for example, controlled by the scheduler 750.

The opto-electronic converters 741 to 74M respectively convert to electrical signals, the optical packets respectively output from the splitters 711 to 71M and output the packets converted into electrical signals to the scheduler 750. The scheduler 750, based on the optical packets (electrical signals) output from the opto-electronic converters 741 to 74M, controls the path switching at the matrix optical switch 730 and the optical packet delay time at the optical delay devices 761 to 76N. For example, the scheduler 750, based on header information included in the optical packets (electrical signals) output from the opto-electronic converters 741 to 74M, acquires the priority level of the optical packet on each path and based on the acquired priority levels, performs control for each path.

The optical delay devices 761 to 76N respectively delay, by given delay times, the optical packets output from the matrix optical switch 730 and output the delayed optical packets to the optical coupler 770. The respective delay times of the optical delay devices 761 to 76N are controlled by the scheduler 750. The optical delay device 100 depicted in FIG. 1, for example, can be applied as the optical delay devices 761 to 76N.

The optical coupler 770 is an N×1 coupler that couples and outputs the optical packets output from the optical delay devices 761 to 76N. The scheduler 750, for example, adjusts the respective delay times of the optical delay devices 761 to 76N such that optical packets do not collide at the optical coupler 770. Since, for example, the delay time can be adjusted in units of the optical packet slot length by the optical delay devices 761 to 76N, control can be easily performed such that optical packets do not collide at the optical coupler 770.

FIG. 7B is a diagram of an example of optical packet control by the optical circuit depicted in FIG. 7A. In FIG. 7B, components identical to those depicted in FIG. 7A are given the same reference numerals used in FIG. 7A and description thereof is omitted. As depicted in FIG. 7B, optical packets 701 to 703 from each of the paths are assumed to be input to the optical circuit 700. Further, in the header of each of the optical packets 701 to 703, the priority level in descending order from the optical packet 703, 702, 701 is assumed to be set.

In this case, the scheduler 750, for example, controls the matrix optical switch 730 to input the optical packets 701 to 703 to the optical delay devices 761, 762, 76N, respectively. Further, the scheduler 750 sets the respective delay times of the optical delay devices 761, 762, 76N in descending order, i.e., in the order of the optical delay devices 761, 762, 76N. As a result, the output of the optical coupler 770 is in the order of the optical packet 703, 702, 701 and thus, the sequence of the packets can be controlled according to priority level. Furthermore, the optical packets 703, 702, 701 can be prevented from colliding.

As depicted in FIGS. 7A and 7B, in the optical circuit 700, the optical signals output from the optical delay devices 761 to 76N are multiplexed by the optical coupler 770 (coupler). The scheduler 750 (determiner) determines the respective delay times in the optical delay devices 761 to 76N such that the optical signals do not collide at the optical coupler 770. The controller 160 in each of the optical delay devices 761 to 76N delays the respective optical signal by the delay time determined by the scheduler 750.

FIG. 8A is a diagram of a second configuration example of the optical circuit that includes the optical delay device. As depicted in FIG. 8A, an optical circuit 800 includes splitters 811, 812; delayers 821, 822, wavelength demultiplexers 831, 832; opto-electronic converters 841, 842; a scheduler 850; n optical delay devices 861 to 86n (where, n is a natural number of 1 or more); n optical delay devices 871 to 87n; a matrix optical switch 880; and wavelength multiplexers 891, 892.

Wavelength multiplexed light in which optical packets of differing wavelengths are multiplexed, is input to the splitters 811, 812, respectively. The splitter 811 splits the input wavelength multiplexed light and outputs the resulting split light to the delayer 821 and the opto-electronic converter 841, respectively. The splitter 812 splits the input wavelength multiplexed light and outputs the resulting split light to the delayer 822 and the opto-electronic converter 842, respectively.

The delayer 821 delays, by a given period, the wavelength multiplexed light output from the splitter 811 and outputs the delayed light to the wavelength demultiplexer 831. The delayer 822 delays, by a given period, the wavelength multiplexed light output from the splitter 812 and outputs the delayed light to the wavelength demultiplexer 832. The wavelength demultiplexer 831 separates into optical packets according to wavelength, the wavelength multiplexed light output from the delayer 821 and outputs the resulting optical packets to the optical delay devices 861 to 86n, respectively. The wavelength demultiplexer 832 separates into optical packets according to wavelength, the wavelength multiplexed light output from the delayer 822 and outputs the resulting optical packets to the optical delay devices 871 to 87n, respectively.

The opto-electronic converters 841, 842 respectively convert into electrical signals, the wavelength multiplexed light output from the splitters 811, 812, respectively, and output the resulting signals to the scheduler 850. The scheduler 850, based on the wavelength multiplexed signals output from the opto-electronic converters 841, 842, controls the respective optical packet delay times at the optical delay devices 861 to 86n, 871 to 87n and the path switching at the matrix optical switch 880. For example, the scheduler 850, based on header information included in the signals output from the opto-electronic converters 841, 842, acquires the priority level of each optical packet, and performs control thereof based on the acquired priority level.

The optical delay devices 861 to 86n respectively delay, by given delay times, the optical packets output from the wavelength demultiplexer 831 and output the delayed optical packets to the matrix optical switch 880. The optical delay devices 871 to 87n respectively delay, by given delay times, the optical packets output from the wavelength demultiplexer 832 and output the delayed optical packets to the matrix optical switch 880. The respective delay times of the optical delay devices 861 to 86n, 871 to 87n are controlled by the scheduler 850. The optical delay device 100 depicted in FIG. 1, for example, can be applied as the optical delay devices 861 to 86n, 871 to 87n.

The matrix optical switch 880 is an optical path switch (optical cross connect) that outputs to the input device of an arbitrary wavelength multiplexer among the wavelength multiplexers 891, 892, the optical packets output from the optical delay devices 861 to 86n, 871 to 87n. The path switching in the matrix optical switch 880, for example, is controlled by the scheduler 850.

The wavelength multiplexers 891, 892 respectively multiplex the optical packets output from the matrix optical switch 880 and output the wavelength multiplexed light obtained by the multiplexing of the optical packets. The scheduler 850, for example, adjusts the respective delay times of the optical delay devices 861 to 86n, 871 to 87n such that optical packets of the same wavelength do not collide at the wavelength multiplexers 891, 892. Since, for example, the delay times can be adjusted in units of optical packet slot length by the optical delay devices 861 to 86n, 871 to 87n, control such that optical packets of the same wavelength do not collide at the wavelength multiplexers 891, 892 can be easily performed.

FIG. 8B is a diagram of an example of optical packet control by the optical circuit depicted in FIG. 8A. In FIG. 8B, components identical to those depicted in FIG. 8A are given the same reference numerals used in FIG. 8A and description thereof is omitted. As depicted in FIG. 8B, optical packets 801, 802 are assumed to be input to the splitters 811, 812 in the optical circuit 800. The destination of each of the optical packets 801, 802 is assumed to be coupled at the output of the wavelength multiplexer 892. Further, in the respective headers of the optical packets 801, 802, the priority level in descending order from the optical packet 801, 802 is assumed to be set. The wavelength of each of the optical packets 801, 802 is assumed to be λ2 and the optical packets 801, 802 are respectively assumed to be input to the optical delay devices 862, 872.

In this case, the scheduler 850 sets the delay time of the optical delay device 862 to be shorter than that of the optical delay device 872. Further, the scheduler 850 controls the matrix optical switch 880 to output to the wavelength multiplexer 892, both of the optical packets 801, 802 output from the optical delay devices 862, 872. As a result, the output of the wavelength multiplexer 892 is in the order of the optical packet 801, 802 and thus, the sequence of the packets can be controlled according to priority level. Furthermore, the optical packets 801, 802 of the same wavelength can be prevented from colliding.

As depicted in FIGS. 8A and 8B, in the optical circuit 800, the optical signals output from the optical delay devices 861 to 86n, 871 to 87n are multiplexed by the wavelength multiplexers 891, 892 (multiplexer). The scheduler 850 (determiner) determines the respective delay times in the optical delay devices 861 to 86n, 871 to 87n such that the optical signals in the wavelength multiplexers 891, 892 do not collide. The controller 160 in each of the optical delay devices 861 to 86n, 871 to 87n delays the respective optical signal by the delay time determined by the scheduler 850.

In this manner, the optical delay device 100 according to the first embodiment inputs an optical packet to the optical path r1 along which light recursively travels along the same path, and outputs from the optical switch 150, the optical packet on the optical path r1 at the time when a given delay time elapses since the input of the optical packet. For example, the optical path r1 includes the mirror 120 that is partially transmissive and transmits a portion of the input light. The optical switch 150 switches between ON (output state) and OFF (non-output state) concerning an optical packet that is from the optical path r1, transmitted by the mirror 120, and is to be output. Thus, the optical packet can be delayed by a given delay time by a configuration of a small scale.

For example, compared to a configuration where a long distance optical path is disposed for each settable delay time, and optical packets are distributed to each path by an optical switch, the optical delay device 100 can be realized by a smaller scale configuration. Consequently, an optical circuit that includes, for example, an optical delay device such as the optical circuit 700 and the optical circuit 800 can be of a smaller scale. Further, for example, compared to a configuration where adjustment is performed while an optical packet is looped, and the optical packet is taken from the loop according to the wavelength variation consequent to the adjustment, the optical delay device 100 can delay an optical packet, independent of the optical packet wavelength.

The optical delay device 100 includes the delay line 130, which is disposed along the optical path r1 and delays the optical packet, consequently, the optical path length of the optical path r1 is assured and a reduction in the size of the optical path r1 is possible, thereby facilitating a reduction in the size of the optical delay device 100. Further, the optical path r1 has an optical path length that is greater than or equal to the distance travelled by light during the maximum optical packet temporal length (slot length), whereby the deterioration of the optical packet consequent to the collision of different portions (e.g., the head and the tail) of the optical packet can be prevented.

The controller 160, when the optical switch 150 is set ON, sets the optical switch 150 to be ON for the optical packet temporal length, whereby the output of optical packets other than those of a specified delay time (reflection count) can be prevented and the deterioration of the optical packets to be output can be suppressed. Further, since configuration can be such that incidence of the optical packet is perpendicular to the partially transmissive mirror 120, for example, wavelength dependency, polarization dependency, polarization mode dispersion, etc. can be suppressed. As a result, drops in transmission quality can be suppressed.

Figure 9A:
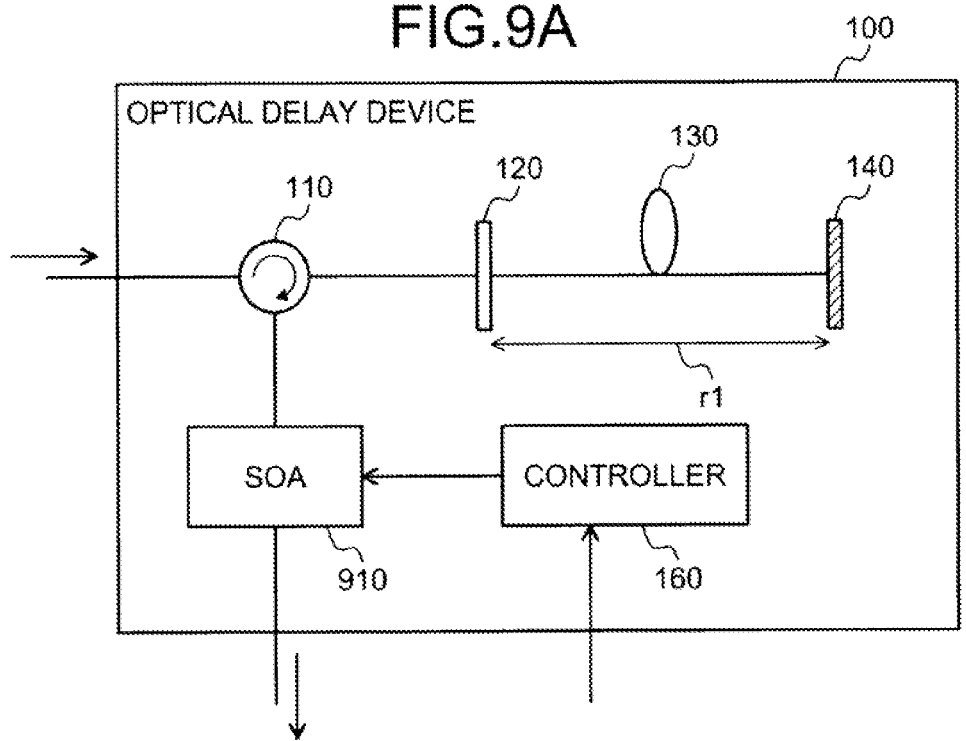
FIG. 9A is a diagram depicting an example of a configuration of the optical delay device according to a second embodiment.

FIG. 9A is a diagram depicting an example of a configuration of the optical delay device according to a second embodiment. In FIG. 9A, components identical to those depicted in FIG. 1 are given the same reference numerals used in FIG. 1 and description thereof is omitted. As depicted in FIG. 9A, the optical delay device 100 according to the second embodiment includes a SOA 910 in place of the optical switch 150 depicted in FIG. 1. The circulator 110 outputs to the SOA 910, the optical packet from the mirror 120.

The SOA 910 is a semiconductor optical amplifier that amplifies by a variable gain, the light output from the circulator 110. The gain of the SOA 910 is controlled by a drive current output from the controller 160. The controller 160 controls the gain of the SOA 910 by the drive current output to the SOA 910.

For example, by turning OFF the drive current, the gain of the SOA 910 becomes 0, thereby enabling the light output from the circulator 110 to be blocked (OFF). Further, by turning ON the drive current, the gain of the SOA 910 becomes greater than 0, thereby enabling the light output from the circulator 110 to be output (ON). By controlling the strength of the drive current, the gain of the SOA 910 can be varied.

In this manner, by using the SOA 910, a function of switching light ON and OFF and amplification of the light by a variable gain are enabled. As a result, drops in the power of the optical packet consequent to the optical packet traveling back and forth along the optical path r1 can be compensated. Further, since the gain of the SOA 910 changes quickly in response to the drive current (e.g., on the order of [ns]), high speed ON/OFF switching of the light can be performed. Consequently, an optical packet of a particular round-trip count can be accurately output from the SOA 910.

For example, the memory of the optical delay device 100 stores therein correspondence information (e.g., a table, equation, etc.) correlating delay times to be induced on optical packets and a value of the drive current of the SOA 910. In the correspondence information, for example, the longer the delay time, the larger the value of the drive current correlated thereto is. The controller 160, based on the delay time to be induced on the optical packet and the correspondence information stored in memory of the optical delay device 100, acquires the value of the drive current for the SOA 910. The controller 160 inputs to the SOA 910, the acquired value of the drive current.

In this manner, the controller 160, for example, controls the SOA 910 such that the longer the delay time to be induced on the optical packet is, the greater the gain of the SOA 910 is. As a result, drops in the power of optical packet consequent to the optical packet traveling back and forth along the optical path r1 can be suppressed and the transmission characteristics of the optical packet can be maintained at a high quality.

Figure 9B:
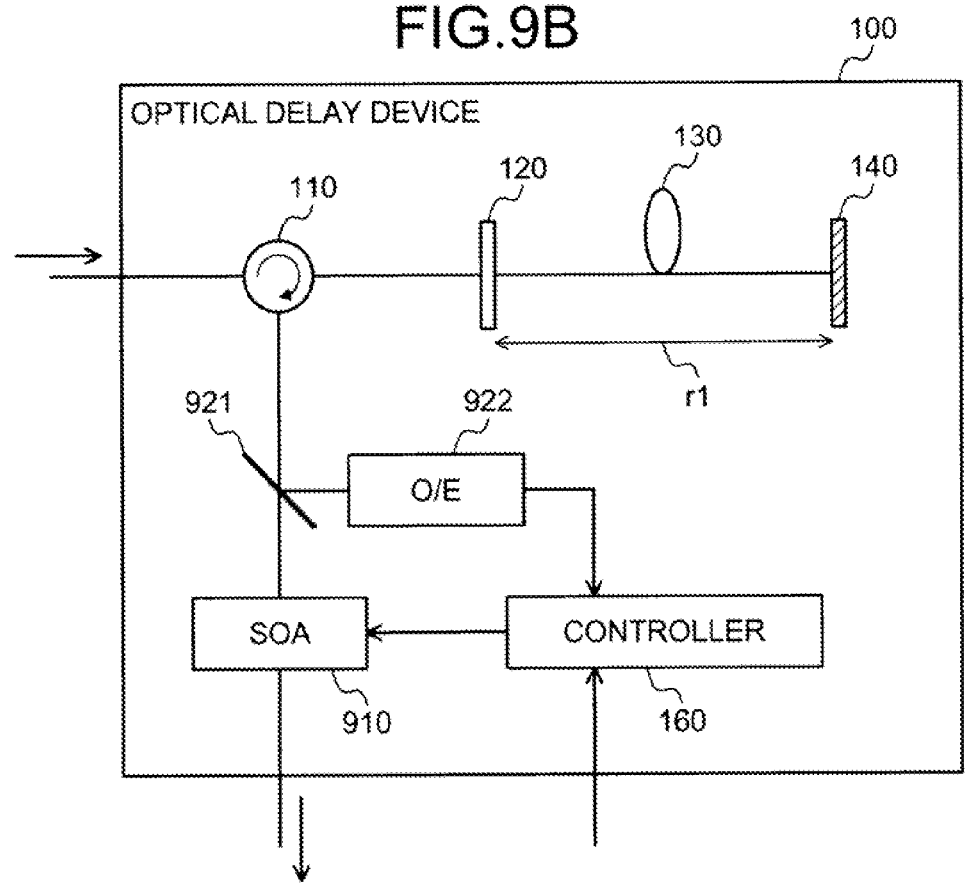
FIG. 9B is a diagram depicting a modification of the optical delay device depicted in FIG. 9A.

FIG. 9B is a diagram depicting a modification of the optical delay device depicted in FIG. 9A. In FIG. 9B, components identical to those depicted in FIG. 9A are given the same reference numerals used in FIG. 9A and description thereof is omitted. As depicted in FIG. 9B, the optical delay device 100 may include a splitter 921 and an opto-electronic converter 922, in addition to the configuration depicted in FIG. 9A. The splitter 921 splits the optical packet output from the circulator 110 and outputs the split optical packet to the SOA 910 and the opto-electronic converter 922, respectively.

The opto-electronic converter 922 opto-electronically converts the optical packet output from the splitter 921 and outputs to the controller 160, a signal indicating the power of the optical packet. Based on the signal output from the opto-electronic converter 922, the controller 160 acquires the power of the optical packet input to the SOA 910 and based on the acquired power, the controller 160 changes the gain of the SOA 910.

For example, the memory of the optical delay device 100 stores therein correspondence information (e.g., a table, equation, etc.) correlating the power acquired based on the signal output from the opto-electronic converter 922 and a value of the drive current of the SOA 910. In the correspondence information, for example, the lower the power is, the larger the value of the drive current correlated thereto is. The controller 160, based on the power acquired based on the signal output from the opto-electronic converter 922 and the correspondence information stored in the memory of the optical delay device 100, acquires the value of the drive current for the SOA 910. The controller 160 inputs to the SOA 910, the acquired value of the drive current.

In the present optical circuit configuration, as depicted in FIG. 2C, if a given delay time is long, the optical power become low and consequently, the gain of the SOA 910 should be increased according to the amount that the power decreases. For example, preferably, based on a signal monitored at the opto-electronic converter 922, decreases in the optical power are caught and based on these results, control is performed such that the driving power of the SOA 910 is increased.

According to the optical delay devices 100 depicted in FIG. 9A and FIG. 9B, the power of the optical packet output from the SOA 910 can be controlled to be a constant value irrespective of the delay time. As a result, deterioration of the SNR (Signal Noise Ratio) consequent to the optical level of the output optical packet being too low can be prevented. Further, deterioration of transmission characteristics consequent to nonlinear effects resulting from the optical level of the output optical packet being too high can be prevented. As a result, transmission characteristics of the optical packet can be maintained at a high quality.

Nonetheless, control by the controller 160 is not limited to controlling the power output from the SOA 910 to be constant. For example, the controller 160 may perform control such that the power output from the SOA 910 is greater that at the time of input to the optical delay device 100. As a result, the optical delay device 100 can be given a function of amplifying the optical packet and consequently, for example, power drops occurring upstream to the optical delay device 100 can be compensated.

FIG. 10 is a flowchart of an example of control by the controller. The controller 160 depicted in FIG. 9B, for example, recursively executes the steps depicted in FIG. 10. The SOA 910 is assumed to be OFF before the execution of the steps depicted in FIG. 10. Steps S1001, S1002 depicted in FIG. 10 are identical to steps S501, S502 depicted in FIG. 5. At step S1002, when the delay time has elapsed (step S1002: YES), the controller 160 acquires from the opto-electronic converter 922, monitored information (step S1003).

Based on the information acquired at step S1003, the controller 160 controls the drive current of the SOA 910 such that a given optical power is output from the SOA 910 (step S1004). Next, the controller 160 determines whether a given period has elapsed since the control of the drive current at step S1004 (step S1005), and if not, waits until the given period elapses (step S1005: NO).

At step S1005, when the given period elapses (step S1005: YES), the controller 160 sets the drive current of the SOA 910 to 0 (step S1006), and ends the series of processes. By the steps above, an optical packet that has been delayed by the notified delay time can be output; and the optical packet can be amplified and output according to the power of the optical packet when input to the SOA 910.

In this manner, the optical delay device 100 according to the second embodiment can achieve the same effects as the optical delay device 100 according to the first embodiment and can output from the SOA 910, an optical packet of the optical path r1. As a result, drops in the power of the optical packet consequent to traveling back and forth along the optical path r1 can be compensated. Further, by using the SOA 910 for which ON/OFF of the drive current is high speed, an optical packet of a specified round-trip count can be accurately output from the SOA 910 and the quality of the optical packet can be improved. Preferably, on the input and output sides of the SOA 910, an isolator is adopted such that the traveling direction of the light is held constant. However, in the present optical circuit configuration, since a circulator is already disposed at the input side of the SOA 910, an isolator only on the output side is sufficient.

The optical delay device 100 according to the second embodiment is applicable to the optical delay device 100 of the optical delay circuit 600 depicted in FIG. 6, the optical delay devices 761 to 76N, 861 to 86n, 871 to 87n of the optical circuits 700, 800 depicted in FIGS. 7A to 8B, etc.

Figure 11:
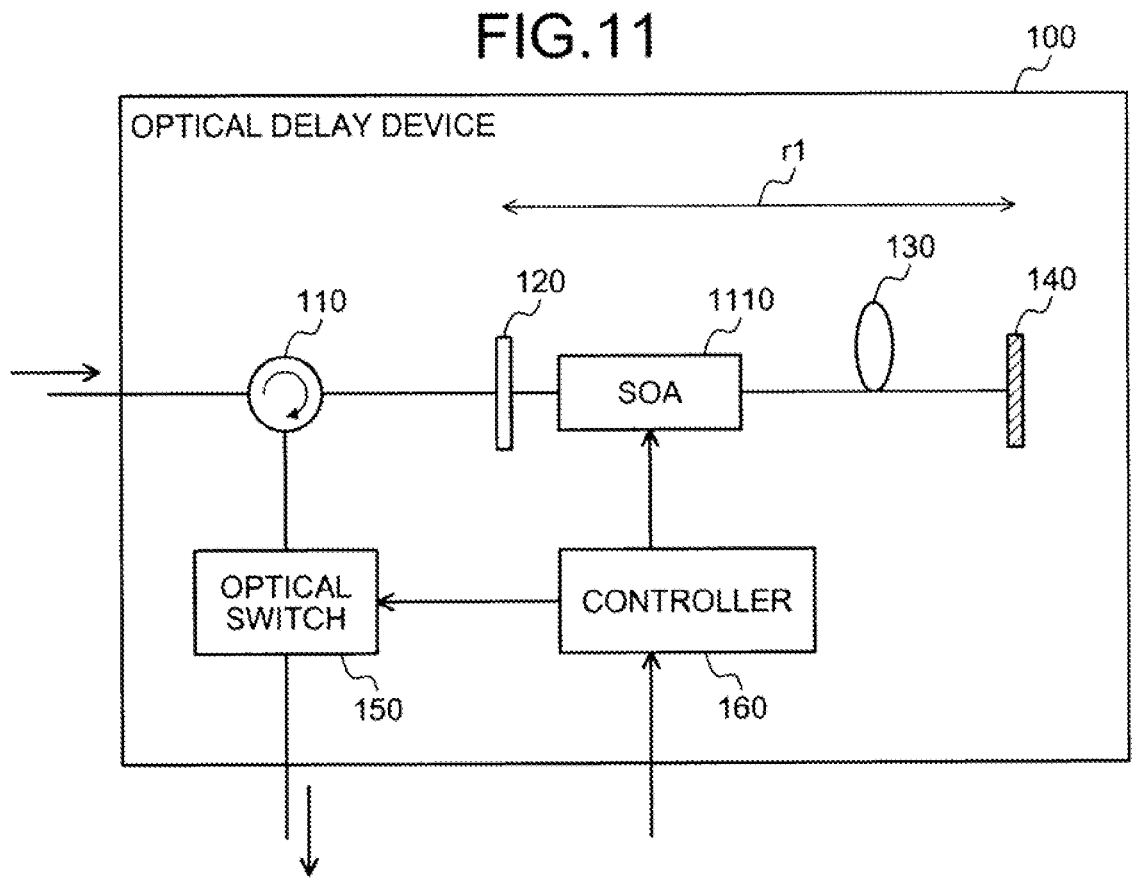
FIG. 11 is a diagram depicting an example of a configuration of the optical delay device according to a third embodiment.

FIG. 11 is a diagram depicting an example of a configuration of the optical delay device according to a third embodiment. In FIG. 11, components identical to those depicted in FIG. 1 are given the same reference numerals used in FIG. 1 and description thereof is omitted. As depicted in FIG. 11, the optical delay device 100 according to the third embodiment includes a SOA 1110 disposed along the optical path r1, in addition to the configuration depicted in FIG. 1. In the example depicted in FIG. 11, the SOA 1110 is disposed between the mirror 120 and the delay line 130. However, the SOA 1110 may be disposed between the delay line 130 and the mirror 140.

The SOA 1110 amplifies the optical packet that travels back and forth along the optical path r1. Here, the SOA 1110 is reversible and thus, while the drive current is supplied to the SOA 1110, the optical packet that is traveling back and forth along the optical path r1 passes through the SOA 1110 bi-directionally.

When the optical packet is input to the optical path r1, the controller 160 sets the SOA 1110 to ON, whereby the optical packet travels back and forth along the optical path r1 while passing through the SOA 1110 bi-directionally. Consequently, for example, if the gain of the SOA 1110 is 1 or more, the optical packet power, which drops with each reflection at the mirror 120, can be compensated.

Further, when the optical switch 150 is set to ON and the optical packet is to be output, the controller 160 sets the SOA 1110 to OFF after the optical packet that is to be output has been reflected by the optical switch 150 and has passed through the SOA 1110. As a result, configuration can be such that only an optical packet delayed by a given delay time is output and any remaining optical packets (light) on the optical path r1 are blocked by the SOA 1110 (the light is absorbed by the medium of the SOA 1110 and dissipated as heat).

An optical packet absorbed by the SOA 1110 is converted to heat and removed from the optical path r1. Consequently, instances can be prevented where (even after output) an optical packet remains on the optical path r1 and collides with the next optical packet input to the optical delay device 100. Thus, it can be said that the present optical circuit configuration is better and more preferable than the configurations depicted in FIGS. 1 and 9A.

Here, since the SOA 1110 (an amplifying medium) is sandwiched between the mirror 120 and the mirror 140 (reflective media), oscillation occurs as a physical phenomenon (e.g., when the gain of the SOA 1110 is G, the reflectivity of the mirrors 120, 140 is respectively R1, R2, then, $G\sqrt{R1R2}>0$). When the SOA 1110 is used on a bi-directional optical path as in FIG. 11, configuration is such that isolators cannot be disposed at the input or the output side of the SOA 1110 and consequently, when the gain of the SOA 1110 increases, oscillation occurs. Therefore, the gain of the SOA 1110 in FIG. 11 has a small characteristic compared to that depicted in FIG. 9. With the SOA 910 used in FIG. 9, isolators can be disposed at the input and output sides of the SOA 910 and thus, gain can be increased without the occurrence of oscillation.

For example, concerning the SOA 111 in FIG. 11, it is sufficient for the controller 160 to set the gain of the SOA 1110 to be less than or equal to the gain that makes the power of the optical packet traveling back and forth along the optical path r1 constant. For example, since a 50% transmissivity of the mirror 120 is equivalent to optical power decreasing by 3 [dB], the gain of the SOA 1110 is set to be 3 [dB] or less. As a result, the gain on the optical path r1 becomes 1 (neither amplification nor attenuation are performed), the decrease in optical power consequent to the mirror 120 is compensated, oscillation on the optical path r1 is suppressed, and a high quality can be maintained.

For example, the gain of the SOA 1110 is set such that the power of the optical packet traveling back and forth on the optical path r1 is constant. As a result, the optical packet power, which drops with each reflection at the mirror 120 is compensated, oscillation is suppressed, and optical transmission characteristics are improved.

Although the gain of a typical SOA in terms of intended purpose is preferably 10 [dB] or greater, the SOA 1110 of the present invention and depicted in FIG. 11, as described above, is operated under a small gain such as 1 (neither amplification nor attenuation are performed) in the range of r1. Thus, since the gain of the SOA 1110 is set small such as 3 [dB] or less, the length of the semiconductor chip of the SOA 1110 can be shorter than that of a typical SOA. Further, since the gain of the SOA 1110 is set small such as 3 [dB] or less, the polarization dependent loss (PDL) of the SOA 1110 is also small and thus, advantageous.

Figure 12:
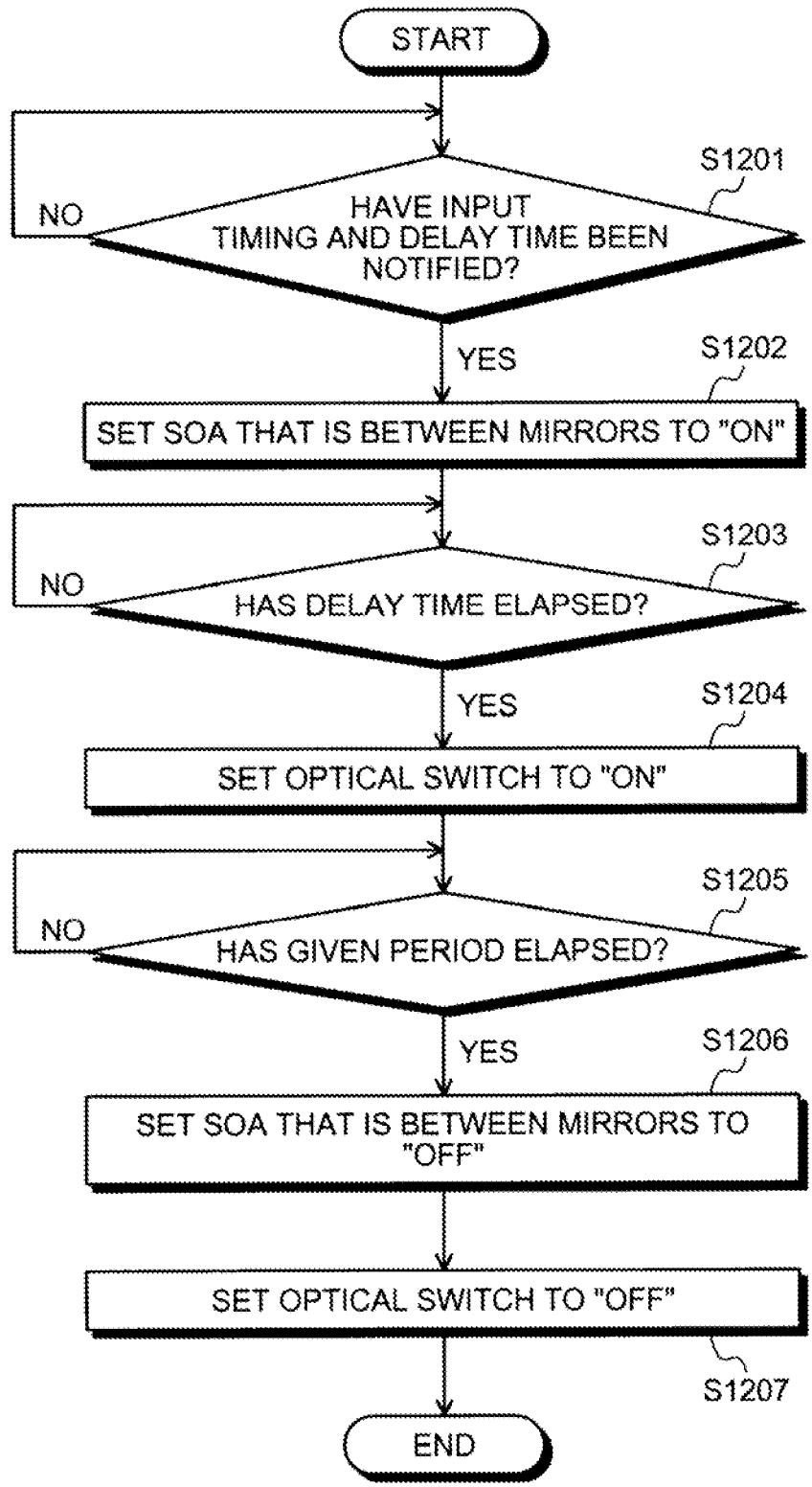
FIG. 12 is a flowchart of an example of control by the controller.

FIG. 12 is a flowchart of an example of control by the controller. The controller 160 depicted in FIG. 11 recursively executes, for example, the steps depicted in FIG. 5. The optical switch 150 and the SOA 1110 are assumed to be OFF before the execution of the steps depicted in FIG. 12. The controller 160 determines whether the input timing at which the optical packet is input to the optical delay device 100 and the delay time to be induced on the input optical packet have been notified (step S1201), and if not, waits until notification is received (step S1201: NO).

At step S1201, when the input timing and the delay time have been notified (step S1201: YES), the controller 160 sets the SOA 1110, which is between the mirrors (the mirror 120, 140), to ON (step S1202). Consequently, the optical packet input to the optical delay device 100 recursively travels between the mirror 120 and the mirror 140, and passes through the SOA 1110. The controller 160 may set the SOA 1110 to ON at the input timing notified at step S1201.

Steps S1203 to S1205 depicted in FIG. 12 are identical to steps S503 to S505 depicted in FIG. 5. At step S1205, when the given period elapses (step S1205: YES), the controller 160 sets the SOA 1110, which is between the mirrors (the mirrors 120, 140) to OFF (step S1206). The controller 160 further sets the optical switch 150 to OFF (step S1207), and ends the series of processes. The order in which step S1206 and step S1207 are performed may be reversed.

By the steps above, an optical packet that has been delayed by the notified delay time can be output and any optical packets remaining between the mirror 120 and the mirror 140 can be absorbed by the SOA 1110. As a result, instances where an optical packet remains on the optical path r1 and collides with the next optical packet input to the optical delay device 100 can be prevented.

In this manner, the optical delay device 100 according to the third embodiment enables any remaining optical packets on the optical path r1 after the optical packet has been output from the optical switch 150, to be absorbed by the SOA 1110. As a result, the same effects obtained by the optical delay device 100 according to the first embodiment can be achieved and deterioration of optical transmission characteristics can be suppressed. Further, drops in power consequent to the optical packet traveling back and forth along the optical path r1 can also be compensated by amplification of the optical packet by the SOA 1110.

The optical delay device 100 according to the third embodiment is applicable to the optical delay device 100 of the optical delay circuit 600 displayed in FIG. 6, the optical delay devices 761 to 76N, 861 to 86n, 871 to 87n of the optical circuits 700, 800 depicted in FIGS. 7A to 8B. In the optical delay device 100 according to the third embodiment, the SOA 910 (see FIGS. 9A, 9B) may replace the optical switch 150.

Figure 13:
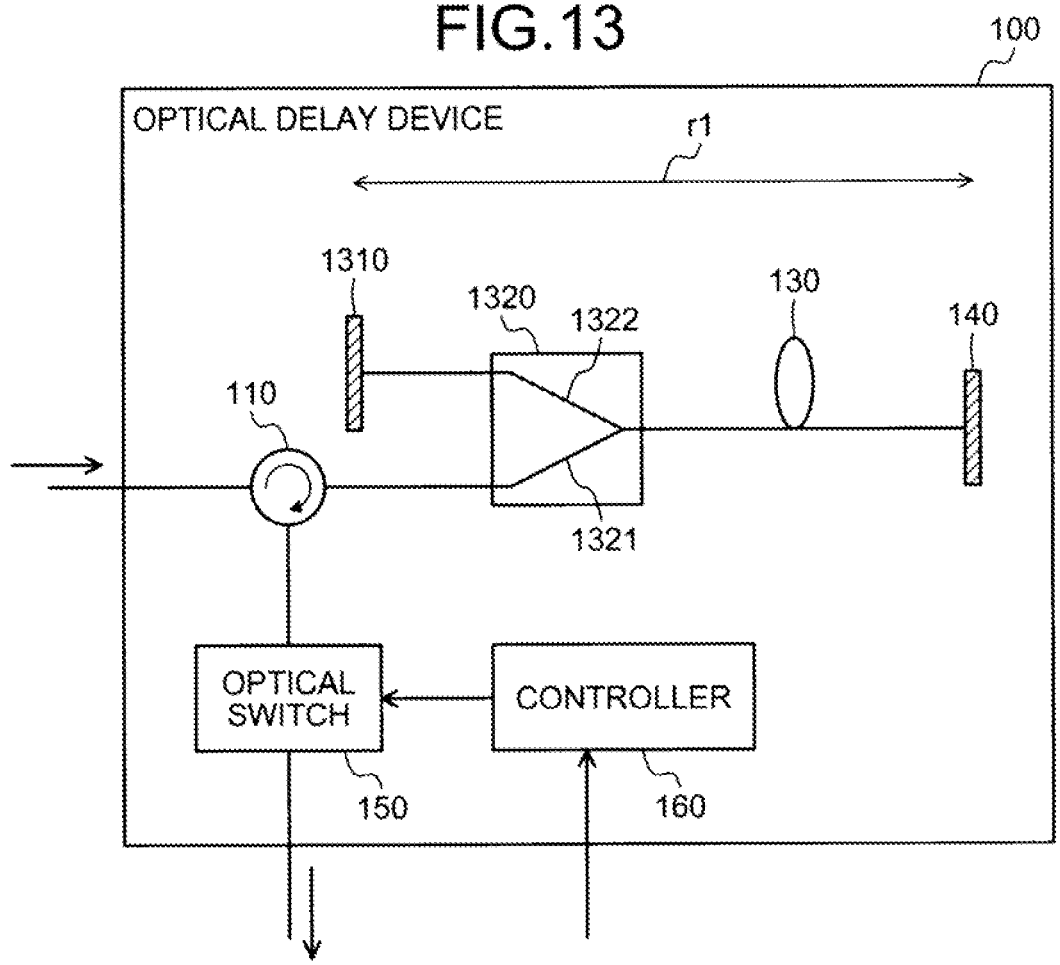
FIG. 13 is a diagram of a first configuration example of the optical delay device according to a fourth embodiment.

FIG. 13 is a diagram of a first configuration example of the optical delay device according to a fourth embodiment. In FIG. 13, components identical to those depicted in FIG. 1 are given the same reference numerals used in FIG. 1 and description thereof is omitted. As depicted in FIG. 13, the optical delay device 100 according to the fourth embodiment includes a mirror 1310 and a path switch 1320 in place of the mirror 120 depicted in the FIG. 1.

The mirror 1310 reflects to the path switch 1320, an optical packet output from the path switch 1320. The reflectivity of the mirror 1310, for example, is ideally 100%. The circulator 110 outputs to the path switch 1320, the optical packet input to the optical delay device 100. The circulator 110 outputs to the optical switch 150, the optical packet output from the path switch 1320.

The path switch 1320 is a path switch capable of switching between a first path 1321 and a second path 1322. The path switch 1320, when set for the first path 1321, outputs to the delay line 130, the optical packet output from the circulator 110; and outputs to the circulator 110, the optical packet output from the delay line 130. The path switch 1320, when set for the second path 1322, outputs to the mirror 1310, the optical packet output from the delay line 130; and outputs to the delay line 130, the optical packet from the mirror 1310.

The path switch 1320 used in this optical circuit configuration preferably has a high speed response in order to guide the optical packet signal to the delay line 130 from the first path 1321 and during the time while the optical packet signal from head to tail is in the delay line 130, to switch from the first path 1321 to the second path 1322 and block the optical packet signal between the mirror 1310 and the mirror 140. For example, a PLZT optical switch using an oxidized compound of lead (Pb), lanthanum (La), zirconium (Zr), or titanium (Ti), a Mach-Zehnder optical switch, etc. can be used as the path switch 1320. Consequently, switching between the first path 1321 and the second path 1322 can be performed at a high speed (e.g., on the order of nanoseconds).

Therefore, the mirror 1310, the second path 1322 of the path switch 1320, the delay line 130 and the mirror 140 form the optical path r1 that the input optical packet recursively travels. In this case, the circulator 110 and the first path 1321 of the path switch 1320 form an input device that inputs to the optical path r1, the optical packet to be delayed.

The controller 160, upon input of an optical packet to the optical delay device 100, causes the path switch 1320 to switch to the first path 1321, whereby the optical packet passes through the first path 1321 and is input to the optical path r1. When the optical packet passes through the path switch 1320, the controller 160 causes the path switch 1320 to switch to the second path 1322, whereby the optical packet travels back and forth between the mirror 1310 and the mirror 140.

The point in time when the optical packet passes through the path switch 1320, for example, is the point in time when a given period of time has elapsed since the optical packet was input to the optical delay device 100. This given period of time is a period (fixed value) determined by the optical path length that the optical packet input to the optical delay device 100 and passing through the delay line 130 travels, and for example, is preliminarily stored in the memory of the optical delay device 100.

The controller 160 causes the path switch 1320 to switch to the first path 1321, at the point in time when a given delay time elapses since the optical packet was input to the optical delay device 100. As a result, the optical packet, which has travelled back and forth along the optical path r1, is transmitted along the first path 1321 and output to the circulator 110; and from the circulator 110 is output to the optical switch 150. The controller 160 switches the optical switch 150 to ON (output state). Consequently, among optical packets input to the optical switch 150, an optical packet delayed by a given delay time can be output.

The controller 160 may maintain the setting of the path switch 1320 to the first path 1321 after the optical packet has been input to the optical path r1 by a switching of the path switch 1320 to the first path 1321. In this case, the optical packet input to the optical path r1 is reflected by the mirror 140, transmitted through the first path 1321, output to the circulator 110, and from the circulator 110 is output to the optical switch 150. In this case, the optical packet is delayed by the shortest delay time and output.

In the optical delay device 100 depicted in FIG. 13, since a partially transmissive reflective medium is not used (ideally, a 100% reflective media is used), the optical packet traveling back and forth along the optical path r1 is not significantly affected by add loss. As a result, even if the optical packet travels round-trip along the optical path r1 numerous times, the power of the optical packet does not significantly drop. Consequently, since the optical delay device 100 can induce a given delay time on the input optical packet and output the optical packet without deterioration thereof, it can be said that the present optical circuit configuration is more preferable than that depicted in FIG. 1.

After outputting from the optical switch 150, an optical packet that has been delayed by a specified delay time and consequent to switching the path switch 1320 from the second path 1322 to the first path 1321 and outputting the optical packet, no optical packets remain on the optical path r1. As a result, instances where an optical packet remains on the optical path r1 and collides with the next optical packet input to the optical delay device 100 can be prevented and therefore, the present optical circuit configuration is more preferable than that depicted in FIG. 9.

Figure 14:
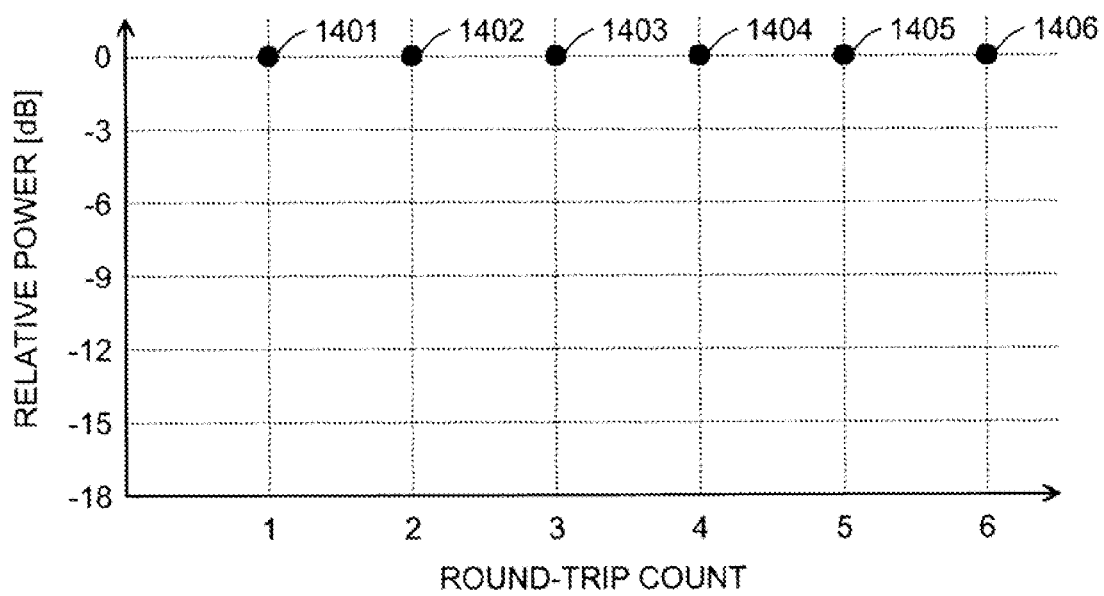
FIG. 14 is a diagram depicting an example of the relationship between the reflection count and the power of the optical packet when the optical circuit configuration depicted in FIG. 13 is used.

FIG. 14 is a diagram depicting an example of the relationship between the reflection count and the power of the optical packet when the optical circuit configuration depicted in FIG. 13 is used. In FIG. 14, components identical to those depicted in FIG. 2C are given the same reference numerals used in FIG. 2C and description thereof is omitted. As indicated by the coordinate points 1401 to 1406 in FIG. 14, in the optical delay device 100 depicted in FIG. 13, irrespective of the number of times that the optical packet travels round-trip along the optical path r1 between the mirror 1310 and the mirror 140, the power of optical packet remains substantially constant. Consequently, the optical delay device 100 can delay the input optical packet by a given delay time and output the optical packet without significant deterioration thereof.

Figure 15:
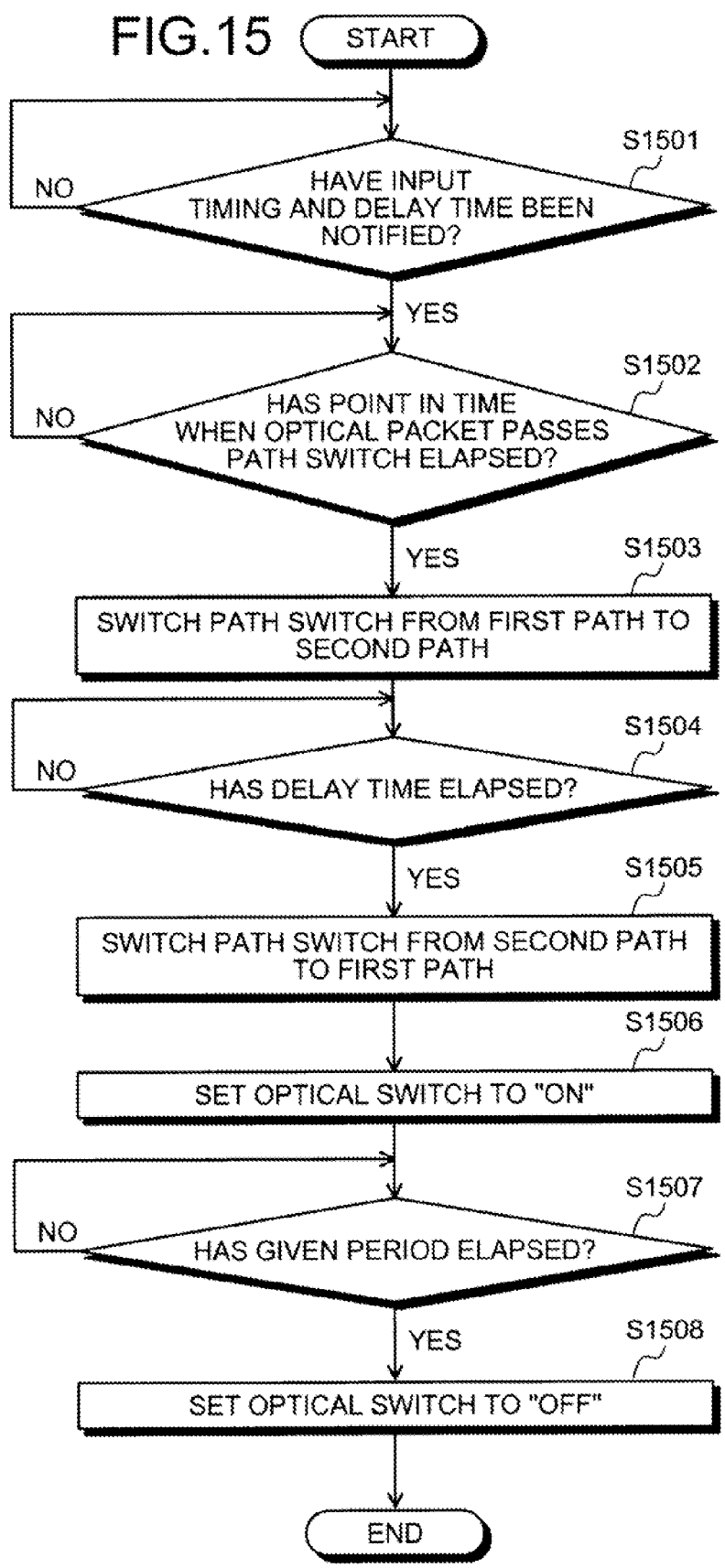
FIG. 15 is a flowchart of control by the controller.

FIG. 15 is a flowchart of control by the controller. The controller 160 depicted in FIG. 13, for example, recursively executes the steps depicted in FIG. 15. The optical switch 150 is assumed to be OFF and the path switch 1320 is assumed to be set to the first path 1321 before the execution of the steps depicted in FIG. 15. The controller 160 determines whether the input timing at which the optical packet is input to the optical delay device 100 and the delay time to be induced on the optical packet input to the optical delay device 100 have been notified (step S1501), and if not, waits until notification has been received (step S1501: NO).

At step S1501, when notification of the input timing and the delay time has been received (step S1501: YES), the controller 160 determines whether the point in time when the input optical packet passes the path switch 1320 has elapsed (step S1502). If not, the controller 160 waits until the point in time when the optical packet passes the path switch 1320 elapses (step S1502: NO).

At step S1502, when the point in time when the optical packet passes the path switch 1320 elapses (step S1502: YES), the controller 160 switches the path switch 1320 from the first path 1321 to the second path 1322 (step S1503). Next, the controller 160 determines whether the notified delay time has elapsed since the time of input notified at step S1501 (step S1504) and if not, waits until the delay time elapses (step S1504: NO). When the delay time elapses (step S1504: YES), the controller 160 switches the path switch 1320 from the second path 1322 to the first path 1321 (step S1505).

Steps S1506 to S1508 depicted in FIG. 15 are identical to steps S503 to S505 depicted in FIG. 5. By the steps above, an optical packet that has been delayed by the notified delay time can be output without significantly reducing the power of the optical packet. Further, configuration is such that optical packets do not remain on the optical path r1. As a result, instances where an optical packet remaining on the optical path r1 collides with the next optical packet input to the optical delay device 100 can be prevented.

In this manner, the optical delay device 100 according to the fourth embodiment inputs an optical packet to the optical path r1, in which light travels the same path recursively, and when a given delay time elapses since the input of the optical packet, the optical delay device 100 outputs by the optical switch 150, the optical packet on the optical path r1. For example, the path switch 1320 capable of switching between the first path 1321 and the second path 1322 is disposed.

The first path 1321 is a path that inputs the optical packet to the optical path r1, and outputs the optical packet from the optical path r1. The second path 1322 is a path by which the optical packet input to the optical path r1 travels the same path recursively. The optical switch 150 switches between transmitting (ON) or blocking (OFF) the optical packet that is output from the optical path r1 by the first path 1321 during a non-output state. As a result, by a small scale configuration, the optical packet can be delayed by a given delay time.

Consequently, effects identical to those of the first embodiment can be achieved and drops in the power of the output optical packet can be suppressed, whereby transmission quality can be improved. Further, without disposal of the SOA 1110 on the optical path r1, the remnants of optical packets on the optical path r1 can be prevented.

Figure 16:
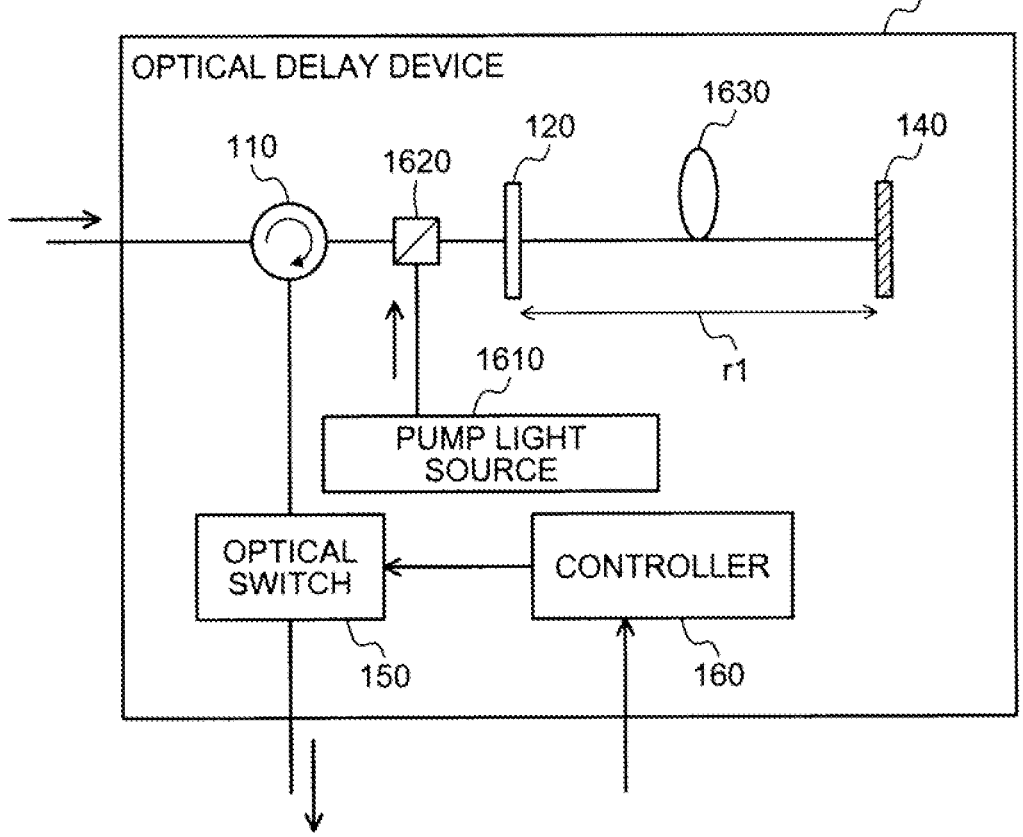
FIG. 16 is a diagram depicting a first configuration example of the optical delay device according to a fifth embodiment.

FIG. 16 is a diagram depicting a first configuration example of the optical delay device according to a fifth embodiment. In FIG. 16, components identical to those depicted in FIG. 1 are given the same reference numerals used in FIG. 1 and description thereof is omitted. As depicted in FIG. 16, the optical delay device 100 according to the fifth embodiment includes a pump light source 1610, a coupler 1620, and an amplifying medium 1630 in place of the delay line 130 depicted in FIG. 1. The pump light source 1610 generates pump light and outputs the pump light to the coupler 1620. The pump light generated by the pump light source 1610 is intended to excite the rare-earth amplifying medium and when the amplifying medium is an erbium-doped optical fiber, preferably has a wavelength of 0.98 [μm] or 1.48 [μm].

The coupler 1620 couples and outputs to the mirror 120, the optical packet output from the circulator 110 and the pump light output from the pump light source 1610. The coupler 1620 further outputs to the circulator 110, the optical packet from the mirror 120. The mirror 120 reflects to the coupler 1620, a portion of the optical packet output from the coupler 1620 and transmits to the amplifying medium 1630 the remaining portion of the optical packet. The mirror 120 further reflects to the amplifying medium 1630, a portion of the optical packet output from the amplifying medium 1630 and transmits to the coupler 1620, the remaining portion of the optical packet.

The amplifying medium 1630 is a delay line implemented by, for example, a coiled erbium doped fiber (EDF). The amplifying medium 1630 delays, by a given time, the optical packet from the mirror 120 and outputs the delayed optical packet to the mirror 140. The amplifying medium 1630 further delays, by a given time, the optical packet from the mirror 140 and outputs the delayed optical packet to the mirror 120. According to the pump light, the amplifying medium 1630 amplifies the optical packet that has been coupled with the pump light.

Although an erbium doped optical fiber applied to a typical erbium doped optical fiber amplifier is typically several tens of meters long and has an erbium doping density of approximately 1000 [ppm], the amplifying medium 1630 applied in the present invention has a function of a delay line and therefore, requires a long length (as described above, at least an optical path length that round-trip is 1 optical packet slot or greater is required). Thus, for example, the amplifying medium 1630 must be 100 [m], i.e., longer than the optical amplifying medium used in a typical optical amplifier. Thus, to obtain the same favorable amplifying performance as a typical optical amplifier, the density of the doped erbium of the amplifying medium 1630 is proportionately less than that of a typical amplifying medium relative to the degree to which the length is greater than that of a typical amplifying medium. The amplifying medium 1630 is implemented by EDF, whereby optical packet is subject to low noise and can be amplified by high gain. As a result, drops in the power of the optical packet consequent to the optical packet traveling back and forth along the optical path r1 can be compensated to a high quality.

By compensating drops in optical packet power, overall transmission characteristics of the optical communication system can be improved. Further, by amplifying the optical packet by the optical delay device 100, the number of optical amplifiers disposed in the optical communication system can be reduced. Although a configuration in which the coupler 1620 is disposed upstream to the amplifying medium 1630 has been described, configuration is not limited hereto, the insert position of the coupler 1620 is not limited, and various types of pump methods (co-propagating, counter propagating, bi-directional propagating, clad pumping, etc.) are applicable. Although an erbium doped optical fiber has been given as an example of the optical path r1, an erbium doped waveguide (EDW), which has a higher refractive index that optical fibers, may be considered in the future to reduce the required optical path length.

Figure 17:
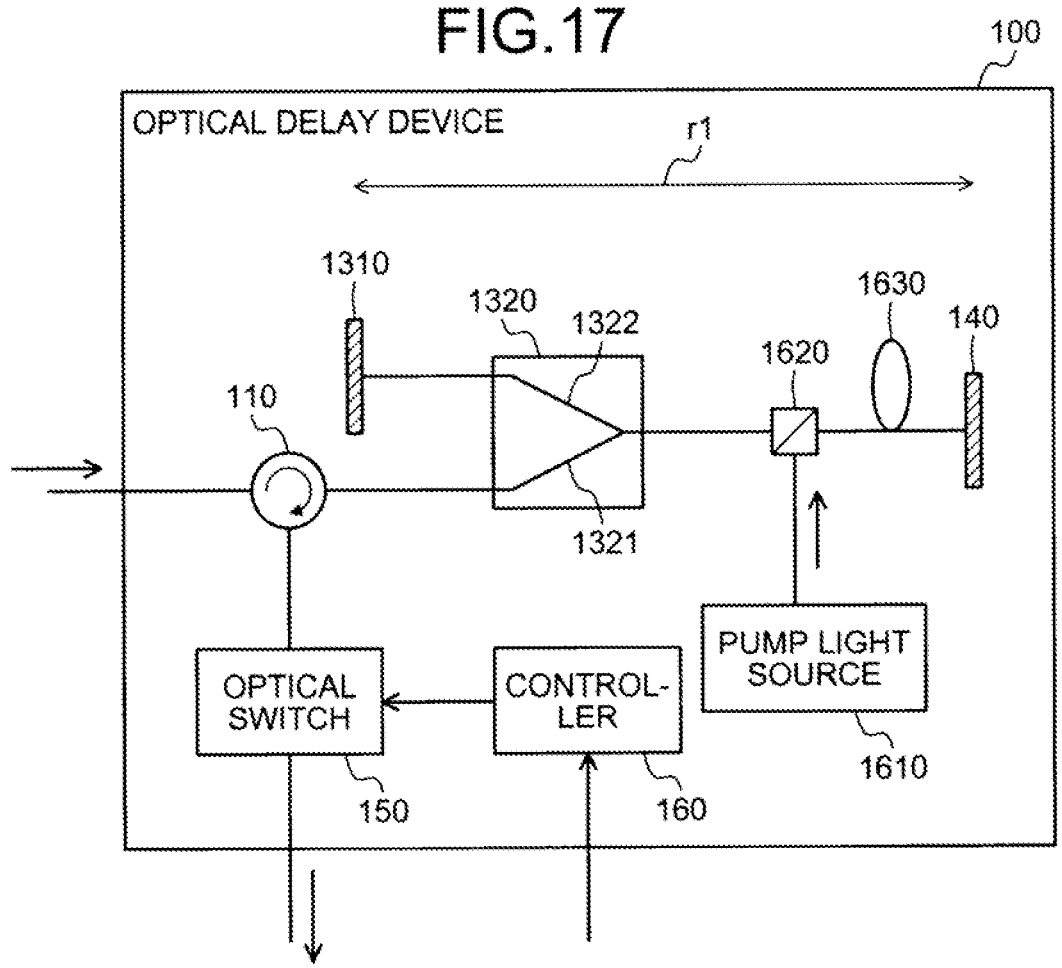
FIG. 17 is a diagram depicting a second configuration example of the optical delay device according to the fifth embodiment.

FIG. 17 is a diagram depicting a second configuration example of the optical delay device according to the fifth embodiment. In FIG. 17, components identical to those depicted in FIGS. 11 and 16 are given the same reference numerals used in FIGS. 11 and 16, and description thereof is omitted. As depicted in FIG. 17, the optical delay device 100 according to the fifth embodiment includes the pump light source 1610, the coupler 1620, and the amplifying medium 1630 in place of the delay line 130 depicted in FIG. 11. In this manner, the pump light source 1610, the coupler 1620, and the amplifying medium 1630 may be applied in the optical delay device 100 according to the third embodiment.

Figure 18:
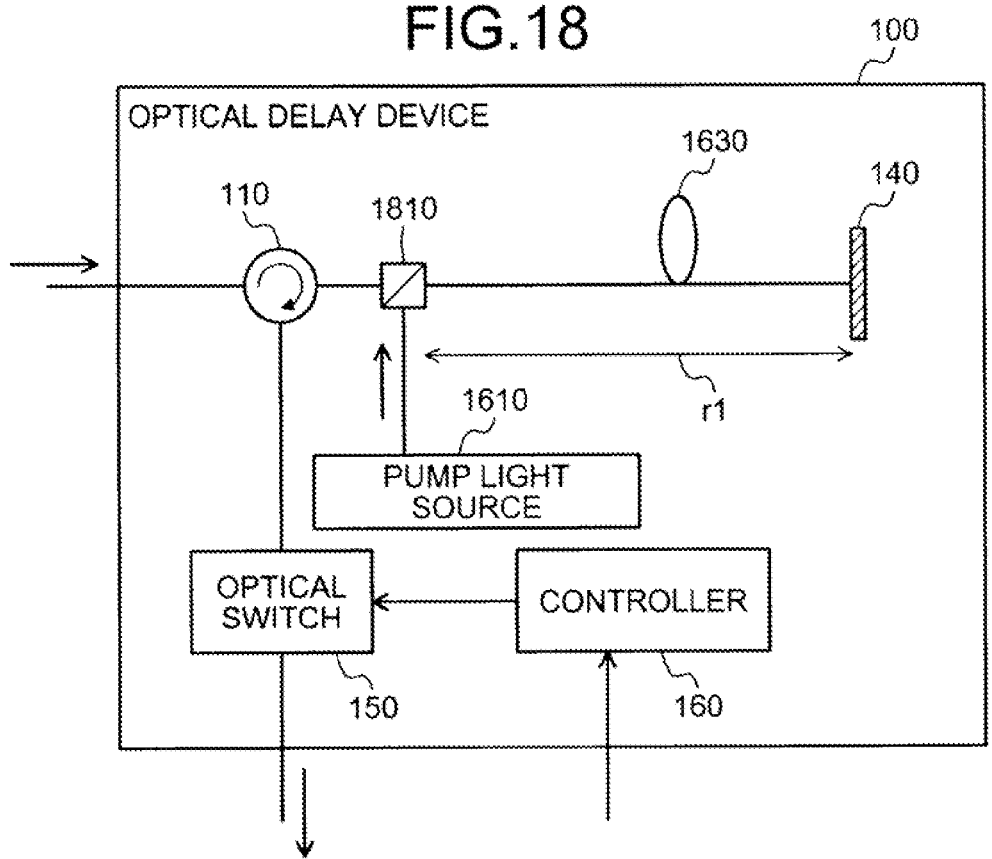
FIG. 18 is a diagram depicting a third configuration example of the optical delay device according to the fifth embodiment.

FIG. 18 is a diagram depicting a third configuration example of the optical delay device according to the fifth embodiment. In FIG. 18, components identical to those depicted in FIG. 16 are given the same reference numerals used in FIG. 16 and description thereof is omitted. As depicted in FIG. 18, in the optical delay device 100 according to the fifth embodiment, the mirror 120 and the coupler 1620 depicted in FIG. 11 may be implemented by an optical filter 1810.

The pump light source 1610 generates pump light and outputs the pump light to the optical filter 1810. The optical filter 1810 reflects to the circulator 110, a portion of the optical packet output from the circulator 110. The optical filter 1810 further couples and outputs to the amplifying medium 1630, the remaining portion of the optical packet and the pump light output from the pump light source 1610.

The optical filter 1810 reflects to the amplifying medium 1630, a portion of the optical packet output from the amplifying medium 1630 and transmits the remaining portion of the optical packet to the circulator 110. In this manner, the mirror 120 and the coupler 1620 are implemented by the optical filter 1810, whereby the number of components of the optical delay device 100 can be reduced. The optical filter 1810 can be implemented by, for example, by a dielectric multilayer film.

Figure 19:
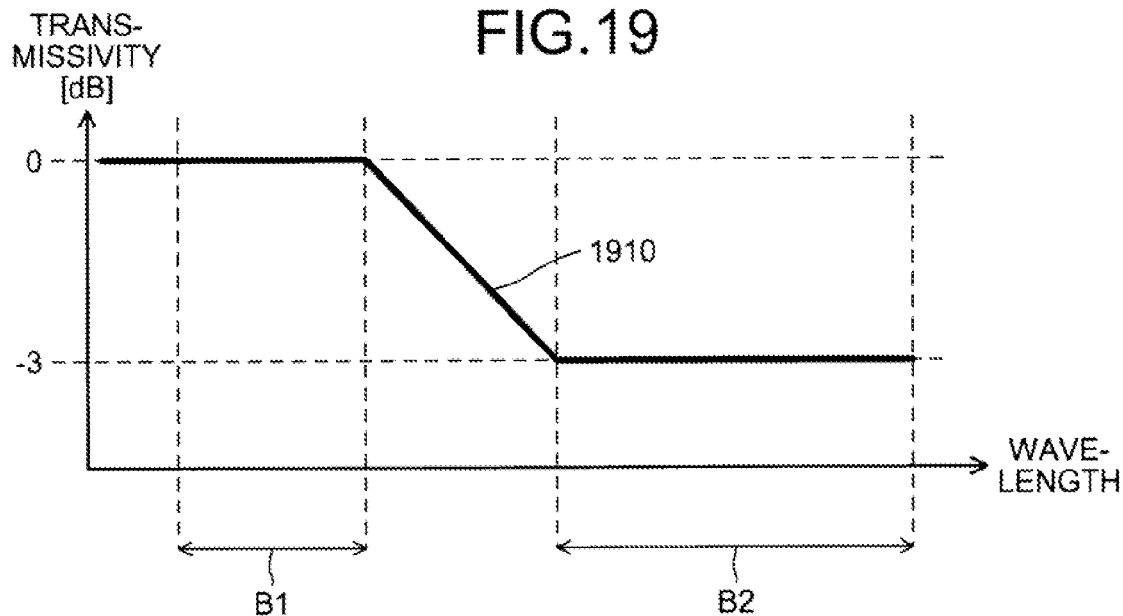
FIG. 19 is a diagram of a first example of properties of an optical filter depicted in FIG. 18.

FIG. 19 is a diagram of a first example of properties of the optical filter depicted in FIG. 18. In FIG. 19, the horizontal axis indicates wavelength and the vertical axis indicates transmissivity [dB]. A curve 1910 is an example of the wavelength-transmissivity properties of the optical filter 1810 depicted in FIG. 18. A pump light band B1 is a wavelength band (e.g., 1530 to 1560 [nm]) of the pump light output from the pump light source 1610. A signal band B2 is a wavelength band (e.g., 960 to 980 [nm] or 1450 to 1490 [nm]) of the optical packet output from the circulator 110.

As depicted by the curve 1910, the transmissivity of the pump light band B1 is 0 [dB], and the optical filter 1810 transmits all of the pump light to the amplifying medium 1630. Further, the transmissivity of the signal band B2 is −3 [dB], and the optical filter 1810 transmits 50% of the optical packet to the amplifying medium 1630 and reflects the remaining 50% to the circulator 110.

FIG. 20 is a diagram depicting a second example of properties of the optical filter depicted in FIG. 18. In FIG. 20, portions identical to those depicted in FIG. 19 are given the same reference numerals and description thereof is omitted. The optical filter 1810 may have wavelength-transmissivity properties indicated by curve 2010 depicted in FIG. 20. Noise bands B3, B4 are wavelength bands (e.g., 1520 to 1530 [nm] or 1560-1570 [nm]) that include only noise, and do not include the wavelengths of the optical packet or the pump light. The curve 2010 has, for example, a transmissivity of −30 [dB] in the noise bands B3, B4.

Thus, by using the optical filter 1810, which has a property (curve 2010) of not transmitting input light in the noise bands B3, B4 that differ from the pump light band B1 and the signal light band B2, noise generated by the amplification of the optical packet can be suppressed.

In this manner, in the optical delay device 100 according to the fifth embodiment, the amplifying medium 1630 is disposed on the optical path r1 and the pump light generated by the pump light source 1610 is coupled with the optical packet on the optical path r1. As a result, the optical packet on the optical path r1 can be delayed and amplified by the amplifying medium 1630.

FIG. 21 is a diagram of a first example of modification of the optical delay device. In FIG. 21, components identical to those depicted in FIG. 1 are given the same reference numerals as those used in FIG. 1 and description thereof is omitted. As depicted in FIG. 21, the optical delay device 100 may include an optical coupler 2110, a looped fiber 2120, the optical switch 150, and the controller 160.

The optical coupler 2110 is a 2-input/2-output 1:1 coupler (3 [dB] coupler). One input of the optical coupler 2110 is connected to an end of the looped fiber 2120. The optical packet input to the optical delay device 100 is input to the other input of the optical coupler 2110. One output of the optical coupler 2110 is connected to the other end of the looped fiber 2120. The other output of the optical coupler 2110 leads to the optical switch 150. The optical switch 150 switches between ON (output state) and OFF (non-output state) concerning the optical packet output from the optical coupler 2110.

Therefore, the looped fiber 2120 forms the optical path r1 in which the input optical packet recursively travels the same path. For example, the optical packet input to the optical delay device 100 continuously travels the looped fiber 2120 and with each pass through the optical coupler 2110, a portion is split and output to the optical switch 150. In this manner, the optical path r1 along which the input packet optical packet recursively travels is not limited to a configuration in which the optical packet travels back and forth between mirrors.

According to the optical delay device 100 depicted in FIG. 21, even if the circulator 110 is not used, the input of the optical packet to the optical path r1 and the output of the optical packet from the optical path r1 is possible. The looped fiber 2120, for example, can be implemented by a coiled optical fiber. As a result, the time consumed by the optical packet to travel 1 loop around the optical path r1 can be made long. For example, the looped fiber 2120 may be of a length 200 [m] or greater, whereby the time consumed by the optical packet to travel 1 loop around the optical path r1 can be made to be 1 [μs] or more.

Here, although configuration is such that the optical packet recursively travels the optical path r1 by the looped fiber 2120, for example, the optical path r1 around which the optical packet recursively travels may be formed by a combination of 3 or more mirrors.

FIG. 22 is a diagram of a second example of modification of the optical delay device. In FIG. 22, components identical to those depicted in FIG. 13 are given the same reference numerals as those used in FIG. 13 and description thereof is omitted. As depicted in FIG. 22, the optical delay device 100 may include a path switch 2210 in place of the circulator 110 and the optical switch 150 depicted in FIG. 13. The optical packet input to the optical delay device 100 is input to the first path 1321 of the path switch 1320.

The path switch 2210 has a configuration corresponding to the optical switch 150 depicted in FIG. 1 and in the example depicted in FIG. 22, in which the path switch 2210 is disposed on the optical path r1, the path switch 2210 is disposed between the delay line 130 and the mirror 140. The path switch 2210 is a path switch that switches between a third path 2211 and a fourth path 2212. The path switch 2210, when set for the third path 2211, transmits to the mirror 140, the optical packet output from the delay line 130, and transmits to the delay line 130, the optical packet from the mirror 140. Further, when set for the fourth path 2212, the path switch 2210 outputs to a device downstream from the optical delay device 100, the optical packet on the optical path r1.

When the optical packet is input to the optical delay device 100, the controller 160 switches the path switch 1320 to the first path 1321 and switches the path switch 2210 to the third path 2211, whereby the optical packet is transmitted along the first path 1321 and is input to the optical path r1. When the optical packet passes the path switch 1320, the controller 160 switches the path switch 1320 to the second path 1322, where the optical packet travels back and forth between the mirror 1310 and the mirror 140.

Further, at a point in time when a given delay time has elapsed since the input of the optical packet to the optical delay device 100, the controller 160 switches the path switch 2210 to the fourth path 2212, whereby the optical packet that has been traveling back and forth along the optical path r1 is transmitted along the fourth path 2212 and output to an external device downstream of the optical delay device 100. As a result, an optical packet that has been induced with a given delay time can be output to a device downstream of the optical delay device 100.

In this manner, by using the path switch 2210 in the removal of the optical packet from the optical path r1, a configuration that omits the circulator 110 is enabled. For example, a PLZT optical switch using an oxidized compound of lead (Pb), lanthanum (La), zirconium (Zr), or titanium (Ti), a Mach-Zehnder optical switch, etc. can be used as the path switch 2210. Consequently, switching between the third path 2211 and the fourth path 2212 can be performed at a high speed.

Figure 23:
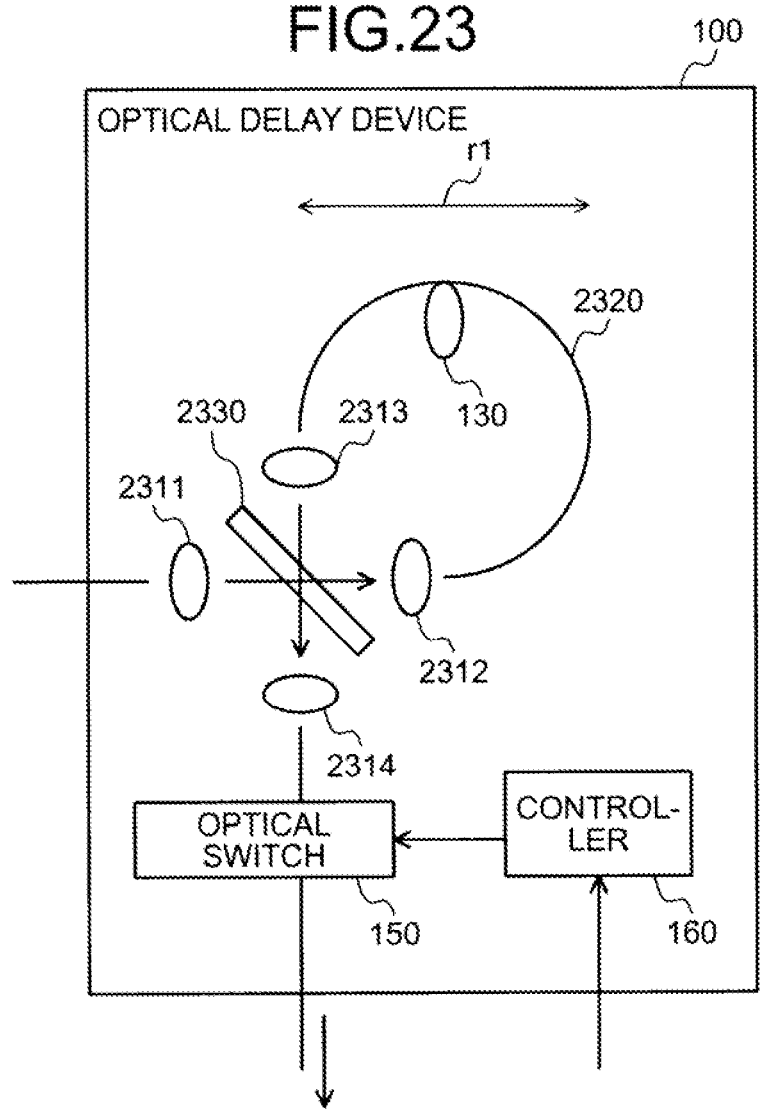
FIG. 23 is a diagram of a third example of modification of the optical delay device.

FIG. 23 is a diagram of a third example of modification of the optical delay device. In FIG. 23, components identical to those depicted in FIG. 1 are given the same reference numerals used in FIG. 1 and description thereof is omitted. As depicted in FIG. 23, the optical delay device 100 may include lenses 2311 to 2314, an optical fiber 2320, and a mirror 2330. The optical packet input to the optical delay device 100 is transmitted through the lens 2311 and is incident to the mirror 2330 at an angle (e.g., 45 degrees).

The mirror 2330 is a partially transmissive reflective medium having a transmissivity of, for example, 50%. For example, at a given reflectivity (e.g., 50%), the mirror 2330 reflects the optical packet output from the lens 2311, causing the optical packet to pass through the lens 2314 and be output to the optical switch 150. The mirror 2330 further transmits the remaining portion of the optical packet output from the lens 2311, whereby the remaining portion of the optical packet passes through the lens 2312 to the optical fiber 2320.

At a given reflectivity (e.g., 50%), the mirror 2330 reflects the optical packet output from the lens 2313, causing the optical packet to pass through the lens 2312 and be output to the optical fiber 2320. The mirror 2330 further transmits the remaining portion of the optical packet, whereby the remaining portion of the optical packet passes through the lens 2314 to the optical switch 150. The optical fiber 2320 outputs to the lens 2313, the optical packet output from the lens 2312. Along the optical fiber 2320, the delay line 130 is disposed and the optical packet is delayed.

Consequently, the mirror 2330, the lens 2312, the optical fiber 2320, and the lens 2313 form the optical path r1 in which the input optical packet cursively travels the same path. For example, the optical packet input to the optical delay device 100 recursively travels between the mirror 2330, the lens 2312, the optical fiber 2320 and the lens 2313, and with each passing of the mirror 2330, a portion of the optical packet is transmitted and output to the optical switch 150. In this manner, the optical path r1 along which the input optical packet recursively travels is not limited to a configuration in which the optical packet travels back and forth between mirrors.

Further according to the optical delay device 100 depicted in FIG. 23, even without the use of the circulator 110, the input of an optical packet to the optical path r1 and the output of the optical packet from the optical path r1 is possible.

Although a configuration is described in which the optical packet from the lens 2312 is input to the lens 2313 by the optical fiber 2320, thereby causing recursive travel of the optical packet, configuration is not limited hereto. For example, here, the optical system that inputs the optical packet from the lens 2312 to the lens 2313 may be implemented using mirrors.

Figure 24A:
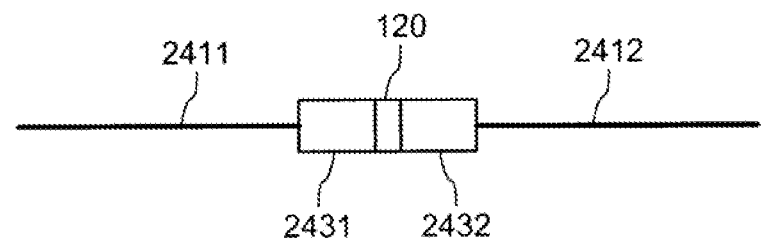
FIG. 24A is a diagram of a first example of connection of a partially transmissive mirror and an optical fiber.

The embodiments and modification examples above can be respectively combined. Further, without departing from the scope of the embodiments and modification examples above, various modifications are possible. For example, in the optical delay device 100 depicted in FIG. 1, configuration may be such that a path switch is disposed in place of the circulator 110. The path switch disposed in place of the circulator 110 is, for example, a path switch capable of switching between a path that outputs to the mirror 120, the input optical packet; and a path that outputs to the optical switch 150, the optical packet output from the mirror 120, FIG. 24A is a diagram of a first example of connection of the partially transmissive mirror and the optical fiber. The mirror 120 depicted in FIG. 24A, for example, is the mirror 120 depicted in FIG. 1. An optical fiber 2411 is an optical fiber on the circulator 110 side of the mirror 120. An optical fiber 2412 is an optical fiber on the delay line 130 side of the mirror 120. An optical connector 2431 is an optical connector disposed at an end of the optical fiber 2411. An optical connector 2432 is an optical connector disposed at an end of the optical fiber 2412.

As depicted in FIG. 24A, a reflective film is vapor deposited on a terminal surface of any one of the optical connector 2431 and the optical connector 2432. This reflective film, for example, can function as the mirror 120. An optical adapter, which is a common means of connection, may be used for the connection of the optical connector 2431 and the optical connector 2432. As a result, the mirror 120 can be formed easily and at a low cost. Further, reductions in the size of the optical delay device 100 can also be realized. Since lenses for coupling light between the mirror 120 and the optical fibers 2411, 2412 need not be disposed, reduced size and lower cost can be realized.

Figure 24B:
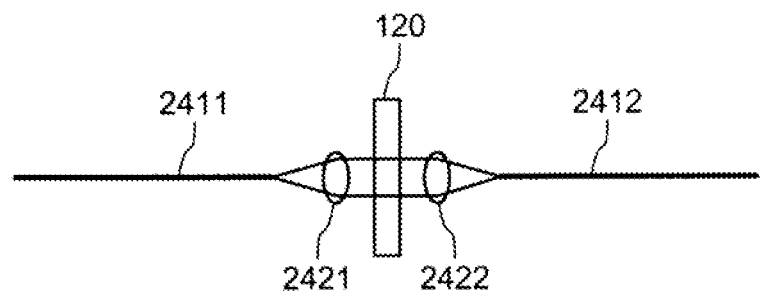
FIG. 24B is a diagram of a second example of connection of the partially transmissive mirror and the optical fiber.

FIG. 24B is a diagram of a second example of connection of the partially transmissive mirror and the optical fiber. In FIG. 24B, components identical to those depicted in FIG. 24A are given the same reference numerals used in FIG. 24A and description thereof is omitted. As depicted in FIG. 24B, for example, a lens 2421 is disposed between the mirror 120 and the optical fiber 2411; and a lens 2422 is disposed between the mirror 120 and the optical fiber 2412.

The lens 2421 collimates and outputs to the mirror 120, light output from an end of the optical fiber 2411. The optical fiber 2411 converges to the end of the optical fiber 2411, light output from the mirror 120. The lens 2422 collimates and outputs to the mirror 120, light output from an end of the optical fiber 2412. The optical fiber 2412 converges to the end of the optical fiber 2412, light output from the mirror 120.

Figure 25A:
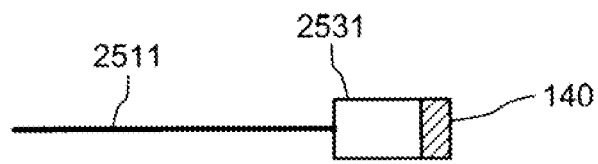
FIG. 25A is a diagram of a first example of connection of a completely reflective mirror and the optical fiber.

FIG. 25A is a diagram of a first example of connection of a completely reflective mirror and the optical fiber. The mirror 140 depicted in FIG. 25A is, for example, the mirror 140 depicted in FIG. 1. An optical fiber 2511 is an optical fiber on the delay line 130 side of the mirror 140. An optical connector 2531 is an optical connector disposed at an end of the optical fiber 2511. As depicted in FIG. 25A, it is sufficient for a reflective film to be vapor deposited on the fiber terminal surface of the optical connector 2531. In this case, the reflective film vapor deposited at the optical connector 2531 is the mirror 140. As a result, the mirror 140 can be formed easily and at a low cost. Further, reductions in the size of the optical delay device 100 are enabled. Since lenses for coupling light of the mirror 140 and the optical fiber 2511 need not be disposed, reductions in size and cost can be achieved.

Figure 25B:
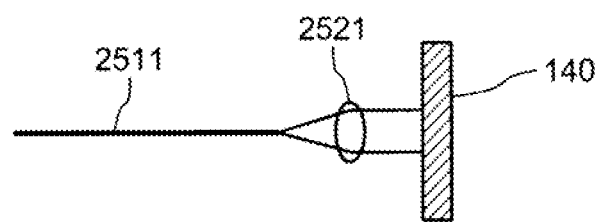
FIG. 25B is a diagram of a second example of connection of the completely reflective mirror and the optical fiber.

FIG. 25B is a diagram of a second example of connection of the completely reflective mirror and the optical fiber. In FIG. 25B, components identical to those depicted in FIG. 25A are given the same reference numerals used in FIG. 25A and description thereof is omitted. As depicted in FIG. 25B, for example, a lens 2521 may be disposed between the mirror 140 and the optical fiber 2511. The lens 2521 collimates and outputs to the mirror 140, light output from an end of the optical fiber 2511. The optical fiber 2511 converges to the end of the optical fiber 2511, light output from the mirror 140.

As described, according to the optical delay device, the optical circuit, and the optical delay method, using a small scale configuration, an optical packet can be delayed by a given delay time. In the embodiments above, although an optical packet has been given as an example of an optical signal to be subject to delay, the optical signal to be subject to delay is not limited to an optical packet and any type of optical signal of a given length is applicable.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical delay device comprising:
   an optical path in which an input optical signal travels the same path recursively;
   an optical switch that switches between an output state of outputting the optical signal input to the optical path, and a non-output state of not outputting the optical signal input to the optical path; and
   a controller that sets the optical switch to the non-output state until a point in time when a given delay time elapses since input of the optical signal to the optical path and at the point in time when the given delay time elapses, switches the optical switch to the output state, wherein
   the optical path is an optical path along which the optical signal recursively travels between a plurality of reflective media,
   at least any one of the reflective media is a partially transmissive medium that transmits a portion of input light, and
   the optical switch, in the non-output state, blocks the optical signal that is from the optical path, and transmitted and output by the partially transmissive reflective medium, and in the output state, passes the optical signal that is from the optical path, and transmitted and output by the partially transmissive reflective medium.

2. The optical delay device according to claim 1, wherein the given delay time is determined based on information indicating the delay time to be induced on the optical signal.

3. The optical delay device according to claim 1 and further comprising
   a delay line that is disposed on the optical path and that delays the optical signal.

4. The optical delay device according to according to claim 1, wherein
   the optical path has an optical path length greater than or equal to a distance covered by the optical signal from head to tail, in the direction of the time axis.

5. The optical delay device according to claim 1, wherein the controller sets the optical switch to the output state for a temporal length of the optical signal, from the point in time when the given delay time elapses.

6. The optical delay device according to claim 1, and further comprising
   a circulator that inputs to the partially transmissive reflective medium, the optical signal that is to be subject to delay and inputs to the optical switch, the optical signal that is from the optical path, and transmitted and output by the partially transmissive reflective medium.

7. The optical delay device according to claim 1, wherein the optical switch is a semiconductor optical amplifier and in the output state, amplifies and outputs the optical signal.

8. The optical delay device according to claim 7, wherein the controller, when switching the optical switch to the output state, sets the gain of the optical signal by the optical switch to be greater, the longer the delay time is.

9. The optical delay device according to claim 1, and further comprising
   a semiconductor optical amplifier that is disposed on the optical path and that passes the optical signal, wherein
   the controller, when switching the optical switch to the output state, causes remnants of the optical signal on the optical path to be absorbed by the semiconductor optical amplifier on the optical path.

10. The optical delay device according to claim 9, wherein the semiconductor optical amplifier disposed on the optical path amplifies the optical signal that is recursively traveling along the optical path such that the power of the optical signal becomes constant.

11. The optical delay device according to claim 1, and further comprising
    a path switch that inputs the optical signal to the optical path and switches between a first path that outputs the optical signal from the optical path and a second path that causes the optical signal input to the optical path to recursively travel the same path, wherein
    the optical switch, when in the output state, passes the optical signal that is from the optical path and output via the first path.

12. The optical delay device according to claim 11, and further comprising
    a circulator that inputs to the optical path, the optical signal from the first path and outputs to the optical switch, the optical signal output from the second path.

13. The optical delay device according to claim 1, and further comprising
    a light source that generates pump light;
    a coupler that couples the generated pump light and the optical signal on the optical path; and
    an erbium doped optical fiber that is disposed on the optical path, delays the optical signal, and amplifies the optical signal according to the pump light.

14. The optical delay device according to claim 13, wherein
    at least any one among a plurality of reflective media on the optical path is a partially transmissive reflective medium, and
    the coupler and the partially reflective medium implement an optical filter that transmits a portion of input light in a wavelength band of the optical signal, and transmits input light in a wavelength band of the pump light.

15. The optical delay device according to claim 14, wherein
the optical filter blocks input light in a wavelength band that is different from the respective wavelength bands of the optical signal and the pump light.

16. The optical delay device according to claim 1, wherein the optical path is a circular optical path along which the optical signal recursively travels.

17. The optical delay device according to claim 1, and further comprising
a path switch that switches between a first path that inputs the optical signal to the optical path and a second path that causes the optical signal input to the optical path to recursively travel the same path, wherein
the optical switch is a path switch that switches between a third path that causes the optical signal input to the optical path to recursively travel the same path and a fourth path that outputs the optical signal from the optical path.

18. An optical circuit comprising:
a plurality of optical delay devices respectively comprising:
an optical path in which an input optical signal travels the same path recursively;
an optical switch that switches between an output state of outputting the optical signal input to the optical path, and a non-output state of not outputting the optical signal input to the optical path; and
a controller that sets the optical switch to the non-output state until a point in time when a given delay time elapses since input of the optical signal to the optical path and at the point in time when the given delay time elapses, switches the optical switch to the output state;
a coupler that couples optical signal respectively output from the optical delay devices; and
a determiner that determines the given delay time for each of the optical delay devices such that the optical signals do not collide at the coupler, wherein
the controller of each of the optical delay devices delays the optical signal by the given delay time respectively determined therefor by determiner.

19. An optical delay device comprising:
an optical path in which an input optical signal travels the same path recursively;
an optical switch that switches between an output state of outputting the optical signal input to the optical path, and a non-output state of not outputting the optical signal input to the optical path; and
a controller that sets the optical switch to the non-output state until a point in time when a given delay time elapses since input of the optical signal to the optical path and at the point in time when the given delay time elapses, switches the optical switch to the output state, wherein
the optical switch is a semiconductor optical amplifier and in the output state, amplifies and outputs the optical signal.

20. An optical delay device comprising:
an optical path in which an input optical signal travels the same path recursively;
an optical switch that switches between an output state of outputting the optical signal input to the optical path, and a non-output state of not outputting the optical signal input to the optical path;
a controller that sets the optical switch to the non-output state until a point in time when a given delay time elapses since input of the optical signal to the optical path and at the point in time when the given delay time elapses, switches the optical switch to the output state; and
a semiconductor optical amplifier that is disposed on the optical path and that passes the optical signal, wherein
the controller, when switching the optical switch to the output state, causes remnants of the optical signal on the optical path to be absorbed by the semiconductor optical amplifier on the optical path.

* * * * *